(12) United States Patent
Chen et al.

(10) Patent No.: US 11,552,074 B2
(45) Date of Patent: Jan. 10, 2023

(54) PACKAGE STRUCTURES AND METHODS OF FABRICATING THE SAME

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 16/900,996

(22) Filed: Jun. 15, 2020

(65) Prior Publication Data
US 2021/0391322 A1 Dec. 16, 2021

(51) Int. Cl.
*H01L 27/06* (2006.01)
*H01L 21/768* (2006.01)
*H01L 21/78* (2006.01)
*H01L 23/538* (2006.01)

(52) U.S. Cl.
CPC .... *H01L 27/0688* (2013.01); *H01L 21/76877* (2013.01); *H01L 21/78* (2013.01); *H01L 23/5384* (2013.01)

(58) Field of Classification Search
CPC ............. H01L 23/5226; H01L 23/5384; H01L 21/76877; H01L 21/78
See application file for complete search history.

(56) References Cited

U.S. PATENT DOCUMENTS

| | | | |
|---|---|---|---|
| 7,775,119 B1* | 8/2010 | Suminto | G01L 9/0055 73/727 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2015/0371957 A1* | 12/2015 | Wang | H01L 21/78 257/620 |

(Continued)

*Primary Examiner* — Jaehwan Oh
*Assistant Examiner* — John M Parker
(74) *Attorney, Agent, or Firm* — JCIPRNET

(57) ABSTRACT

A package structure and a method of fabricating the same are provided. The method includes bonding a first die and a second die to a wafer in a first die region of the wafer hybrid bonding; bonding a first dummy structure to the wafer in the first die region and a first scribe line of the wafer; and singulating the wafer and the first dummy structure along the first scribe line to form a stacked integrated circuit (IC) structure.

20 Claims, 31 Drawing Sheets

(56) References Cited

U.S. PATENT DOCUMENTS

| | | | |
|---|---|---|---|
| 2017/0062383 A1* | 3/2017 | Yee | H01L 24/17 |
| 2018/0138101 A1* | 5/2018 | Yu | H01L 23/147 |
| 2020/0006143 A1* | 1/2020 | Huang | H01L 23/49827 |

* cited by examiner

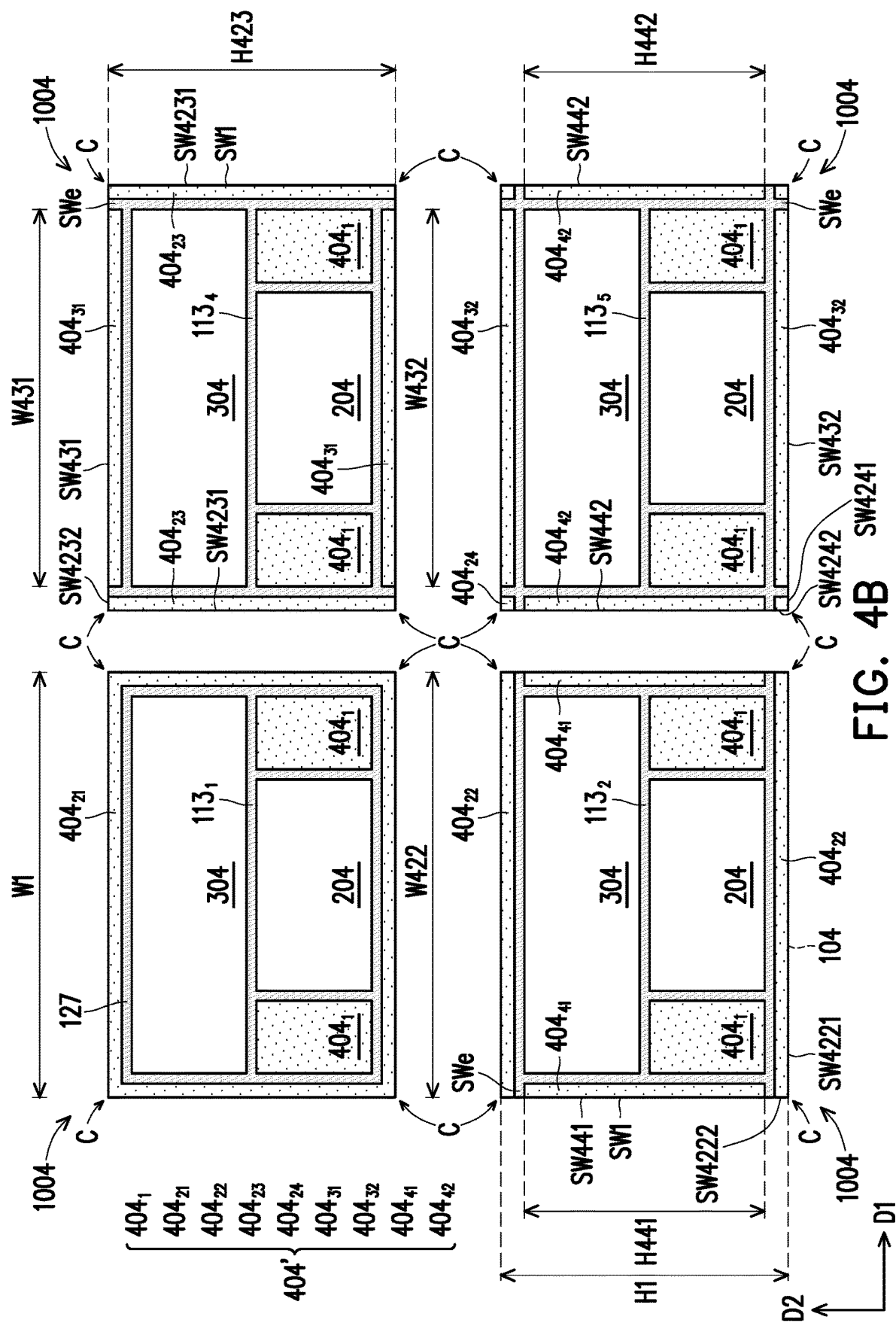

PACKAGE STRUCTURES AND METHODS OF FABRICATING THE SAME

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 6A illustrate top views of the wafer-level die structure illustrated in FIG. 1B in accordance with some embodiments.

FIGS. 2B to 6B illustrate top views of the individual 3DIC structures singulated from the wafer-level die structure illustrated in FIGS. 2A to 6A in accordance with some embodiments.

DETAILED DESCRIPTION

Figure 1A:
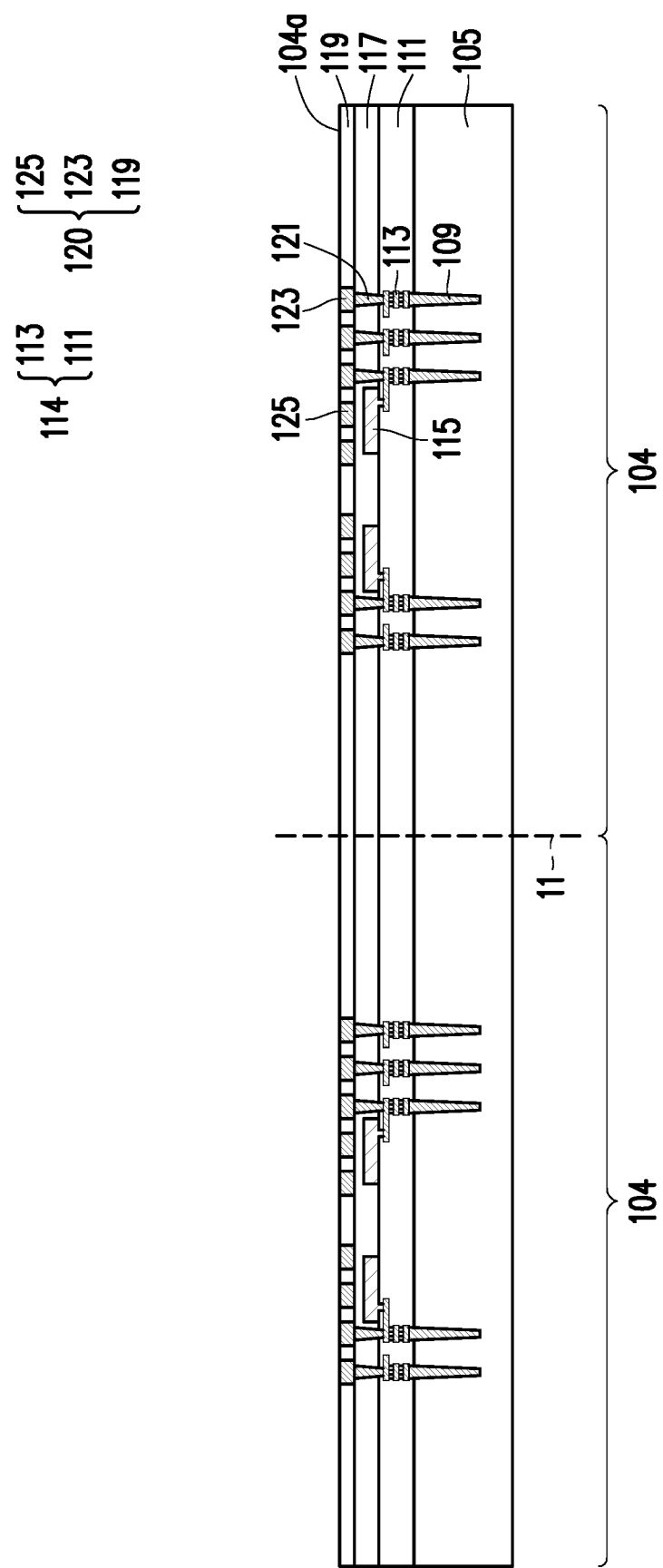
FIG. 1A to FIG. 1H are schematic cross-sectional views illustrating a method of forming a 3DIC structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on" "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 8:
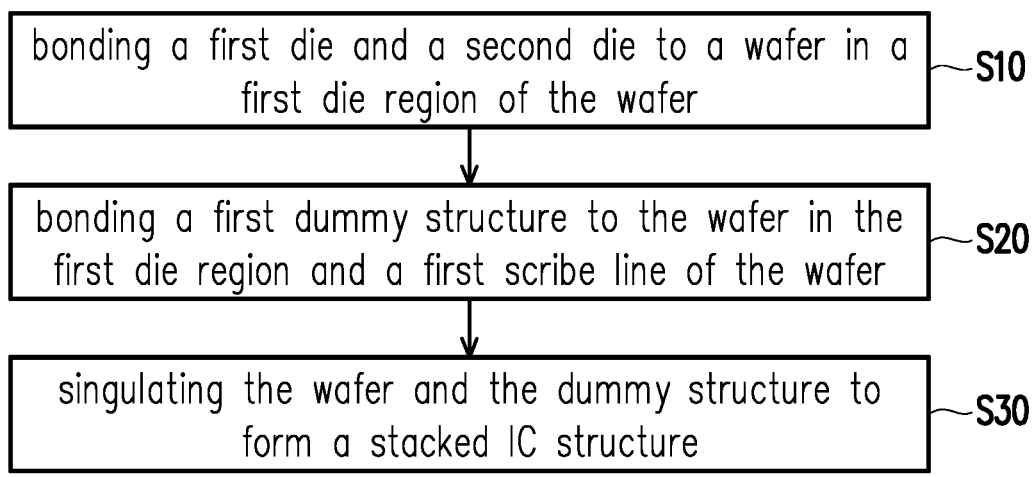
FIG. 8 illustrates a process flow for forming a 3DIC structure in accordance with some embodiments.

FIG. 1A to FIG. 1H are schematic cross-sectional views illustrating a method of forming a 3DIC structure according to some embodiments of the disclosure. The steps shown in FIG. 1A to FIG. 1H are also reflected schematically in the process flow shown in FIG. 8.

Referring further to FIG. 1A, a wafer 100 having a plurality of integrated circuit (IC) dies 104 is provided. In accordance with some embodiments of the present disclosure, the IC dies 104 may be logic dies (e.g., central processing unit, graphics processing unit, system-on-a-chip, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the IC dies 104 may be different sizes (e.g., different heights and/or surface areas), and in other embodiments, the IC dies 104 may be the same size (e.g., same heights and/or surface areas).

The wafer 100 includes a substrate 105 and a bonding structure 120 over the substrate 105. In some embodiments, the substrate 105 may be formed of silicon, although it may also be formed of other group III, group IV, and/or group V elements or compounds, such as silicon, germanium, gallium, arsenic, and combinations thereof. The substrate 105 may also be in the form of silicon-on-insulator (SOI). The SOI substrate may include a layer of a semiconductor material (e.g., silicon, germanium and/or the like) formed over an insulator layer (e.g., buried oxide and/or the like), which is formed on a semiconductor (such as silicon) substrate. In addition, other substrates that may be used include multi-layered substrates, gradient substrates, hybrid orientation substrates, any combinations thereof and/or the like.

In some embodiments, the substrate 105 may include through vias (TVs) 109 that extend from a front surface of the substrate 105 toward a backside surface of the substrate 105. In some embodiments, the TVs 109 may be formed by forming openings in the substrate 105 and filling the openings with suitable conductive materials. In some embodiments, the openings may be formed using suitable photolithography and etching methods. The openings may be filled with copper, a copper alloy, silver, gold, tungsten, tantalum, aluminum, a combination thereof, or the like, using physical vapor deposition (PVD), atomic layer deposition (ALD), electro-chemical plating, electroless plating, or a combination thereof, the like. In some embodiments, a liner layer and/or an adhesive layer may be formed in the openings before filling the openings with the suitable conductive materials. In some other embodiments, the substrate 105 may not include through vias (TVs) 109, and through dielectric vias (TDVs) may be formed in the subsequent process. The TDVs are formed in a dielectric layer around top dies on the bonding structure 120 to being connected to bond pads 123 of the bonding structure 120.

The wafer 100 may further include one or more integrated circuit devices, an interconnect structure 114, contact pads 115 and a dielectric layer 117 between the substrate 105 and the bonding structure 120. The integrated circuit devices may be active and/or passive devices. The one or more active and/or passive devices may be formed on and/or in the substrate 105. In some embodiments, the one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like. The interconnect structure 114 is formed over the substrate 105 and the one or more active and/or passive devices. The interconnect structure 114 may provide electrical connections between the one or more integrated circuit devices formed on the substrate 105. The interconnect structure 114 may include a plurality of dielectric layers (such an inter-layer dielectric (ILD)/inter-metal dielectric layers (IMDs)) and interconnects 113 (such as conductive lines and vias) within the dielectric layers 111. The dielectric layers 111 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like. In some embodiments, the interconnects 113 may include copper, a copper alloy, silver, gold, tungsten, tantalum, aluminum, a combination thereof, or the like.

The contact pads 115 are formed over the interconnect structure 114. The contact pads 115 may be electrically coupled to the one or more active and/or passive devices through the interconnects 113. In some embodiments, the contact pads 115 may include a conductive material such as aluminum, copper, tungsten, silver, gold, a combination thereof, or the like.

The dielectric layer 117 is formed over the interconnect structure 114 and the contact pads 115. In some embodiments, the dielectric layer 117 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like. In other embodiments, the dielectric layer may include one or more layers of photo-patternable insulating materials such as polybenzoxazole (PBO), polyimide (PI), benzocyclobutene (BCB), a combination thereof, or the like In some embodiments, the dielectric layer is planarized using a CMP process, a grinding process, an etching process, a combination thereof, or the like.

Referring to FIG. 1A, the bonding structure 120 is formed on the dielectric layer 117. The bonding structure 120 includes an insulating layer 119 formed on the dielectric layer 117 and the bond pads 123 formed in the insulating layers 119. In some embodiments, the bonding structure 120 further includes dummy pads 125 formed in the insulating layer 119. The bond pads 123 are in direct electrical contact with vias 121 formed in the dielectric layer 117 to electrically connect to the interconnects 113.

In some embodiments, the insulating layer 119 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In some embodiments, the insulating layer 119 is planarized using a CMP process, a grinding process, an etching process, a combination thereof, or the like. In some embodiments, the insulating layer 119 and the underlying dielectric layer may include a same material. In other embodiments, the insulating layer 119 and the underlying dielectric layer may include different materials.

In some embodiments, the bond pads 123, dummy pads 125 and the vias 121 may include a conductive material such as aluminum, copper, tungsten, silver, gold, a combination thereof, or the like. In some embodiments, a conductive material may be formed over the interconnect structure using, for example, PVD, ALD, electro-chemical plating, electroless plating, a combination thereof, or the like. Subsequently, the conductive material is patterned to form the contact pads using suitable photolithography and etching methods. The bond pads 123, dummy pads 125 and the vias 121 may be formed in the insulating layer 119 using, for example, a damascene process, a dual damascene process, a combination thereof, or the like. In some embodiments, the bond pads 123, the dummy pads 125 and the insulating layer 119 are planarized, such that topmost surfaces of the bond pads 123 and the dummy pads 125 are substantially level or coplanar with a topmost surface of the insulating layer 119.

Figure 1B:
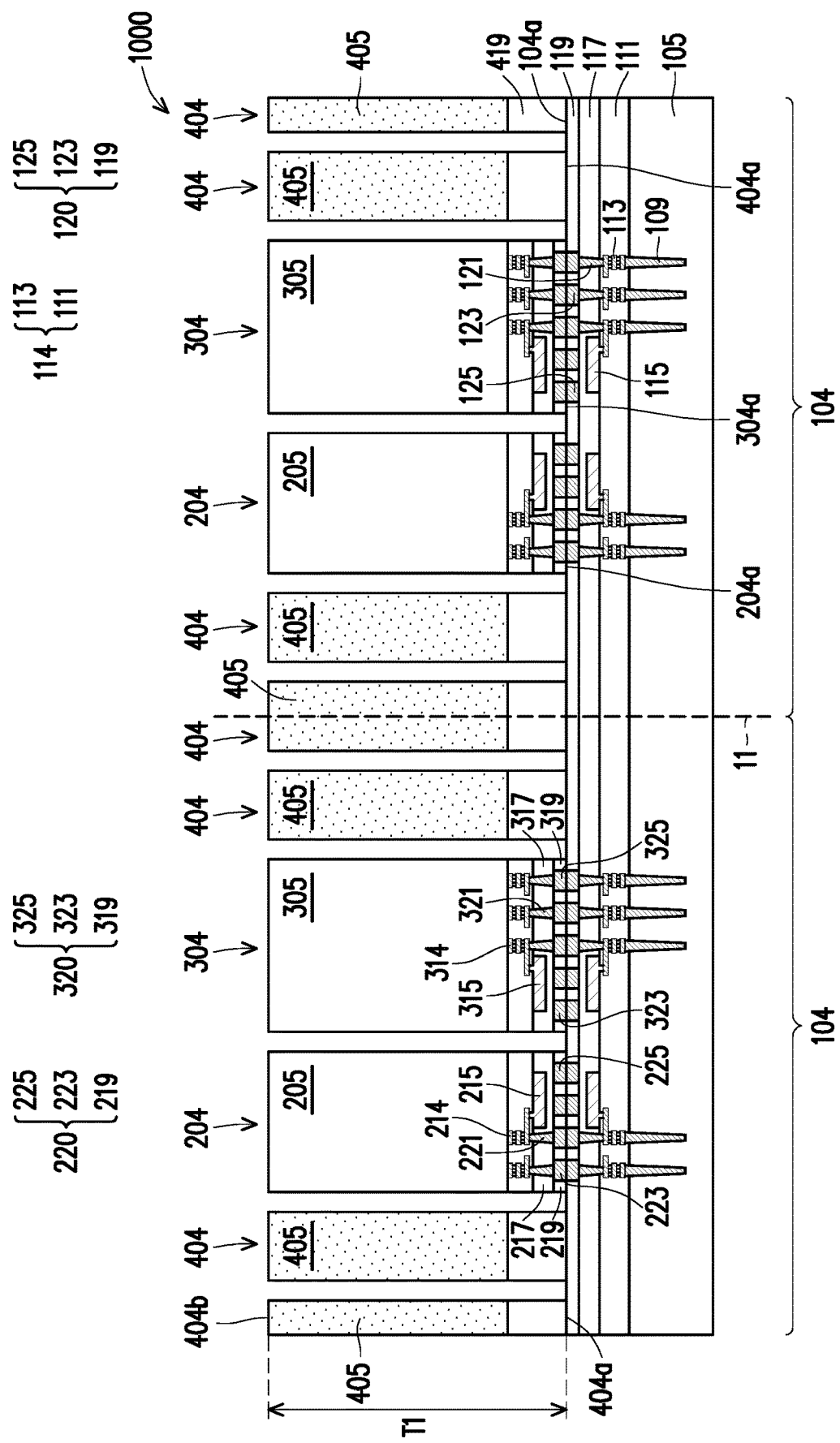

Referring to FIG. 1B, device dies 204 and device dies 304 are bonded to the first side of the wafer 100 to start forming a wafer-level die structure 1000. The respective process is illustrated as step S10 in the process flow shown in FIG. 8. The device dies 204 may be logic dies (e.g., central processing unit, graphics processing unit, system-on-a-chip, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the device dies 204 may be different sizes (e.g., different heights and/or surface areas), and in other embodiments, the device dies may be the same size (e.g., same heights and/or surface areas).

The device dies 304 include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, a device dies 304 may include both memory dies and a memory controller, such as, for example, a stack of four or eight memory dies with a memory controller. Also, in some embodiments, the device dies 304 may be different sizes (e.g., different heights and/or surface areas), and in other embodiments, the device dies 304 may be the same size (e.g., same heights and/or surface areas).

The device dies 204 may include substrate 205, one or more active and/or passive devices (not shown), and interconnect structure 214, contact pads 215, a dielectric layer 217, vias 221, and a bonding structure 220. The bonding structure 220 includes bond pads 223, dummy pads 225 and an insulating layer 219. The device dies 304 may include substrate 305, one or more active and/or passive devices (not shown), and interconnect structure 314, contact pads 315, a dielectric layer 317, vias 321, and a bonding structure 320. The bonding structure 320 includes bond pads 323, dummy pads 325 and an insulating layer 319.

In some embodiments, the materials and the formation methods of the substrates 205 and 305, the interconnect structures 214 and 314, the contact pads 215 and 315, the dielectric layer 217 and 317, the vias 221 and 321, and the bonding structures 220 and 320 of the device dies 204 and 304 may be similar to the substrate 105, the interconnect structure 114, the contact pads 115, the dielectric layer 117, the vias 121 and the bonding structure 120 of the wafer 100, and hence the details are not repeated herein.

The bonding of the device dies 204 and 304 to the wafer 100 may be achieved through hybrid bonding. For example, the bond pads 223 and 323 are bonded to the bond pads 123 of the IC dies (or referred to as bottom dies) 104, and the dummy pads 225 and 325 are bonded to the dummy pads 125 of the IC dies 104 through metal-to-metal direct bonding. In accordance with some embodiments of the present disclosure, the metal-to-metal direct bonding is copper-to-copper direct bonding. The bond pads 223 and 323 may have sizes greater than, equal to, or smaller than, the sizes of the respective the bond pads 123. The dummy pads 225 and 325 may have sizes greater than, equal to, or smaller than, the sizes of the respective dummy bond pads 125. Furthermore, the insulating layer 219 and 319 are bonded to the insulating layer 119 through dielectric-to-dielectric bonding, which may be fusion bonding, for example, with Si—O—Si bonds generated. To achieve the hybrid bonding, the device dies 204 and 304 are first pre-bonded to the insulating layer 119, the bond pads 223 and dummy pads 225 by lightly pressing the device die 204 and 304 against the IC dies 104. An anneal is then performed to incur the inter-diffusion of the metals in the bond pads 223 and 323 and the dummy pads 225 and 325 and the corresponding overlying the bond pads 123 and the dummy pads 125.

Referring to FIG. 1B, dummy structures 404 are bonded to the insulating layer 119 of the wafer 100 such that each device die 204 and each device die 304 are interposed between adjacent dummy structures 404. The respective process is illustrated as step S20 in the process flow shown in FIG. 8. The number of dummy dies 404 in FIG. 1B is used to illustrate. Each IC die 104 may have one or more dummy structures 404. In addition, adjacent IC dies 104 may share a dummy structure 404. The dummy structures 404 may be made of a bulk material 405. In some embodiments, the dummy structures 404 may include a same material as the substrate 105 of the IC dies 104. In some embodiments, dummy structures 404 may not include active and/or passive devices, and may not provide additional electrical functionality to the resulting IC packages. In some embodiments, each dummy structure 404 may include an insulating layer 419 on one side of the bulk material 405. In some embodiments, the insulating layers 419 may be formed using similar materials and methods as the insulating layer 119, and description is not repeated herein. In some embodiments, the insulating layers 419 and the insulating layer 119 may include a same material. In other embodiments, the insulating layers 419 and the insulating layer 119 may include different materials.

In some embodiments, frontside surfaces 404a of the dummy structures 404 are bonded to frontside surfaces 104a of the IC dies 104 by bonding of the insulating layers 419 to the insulating layer 119. In some embodiments, the insulating layers 419 may be bonded to the insulating layer 119 using a direct bonding method, such a fusion bonding method. In some embodiments, surface treatment processes may be performed on the insulating layers 419 and the insulating layer 119 prior to bonding the insulating layers 419 to the insulating layer 119. In other embodiments, the insulating layers 419 may be bonded to the insulating layer 119 using other suitable bonding methods or using an adhesive. In some embodiments, an annealing process may be performed after bonding the dummy structures 404 to the wafer 100 to strengthen the bond.

Figure 2A:
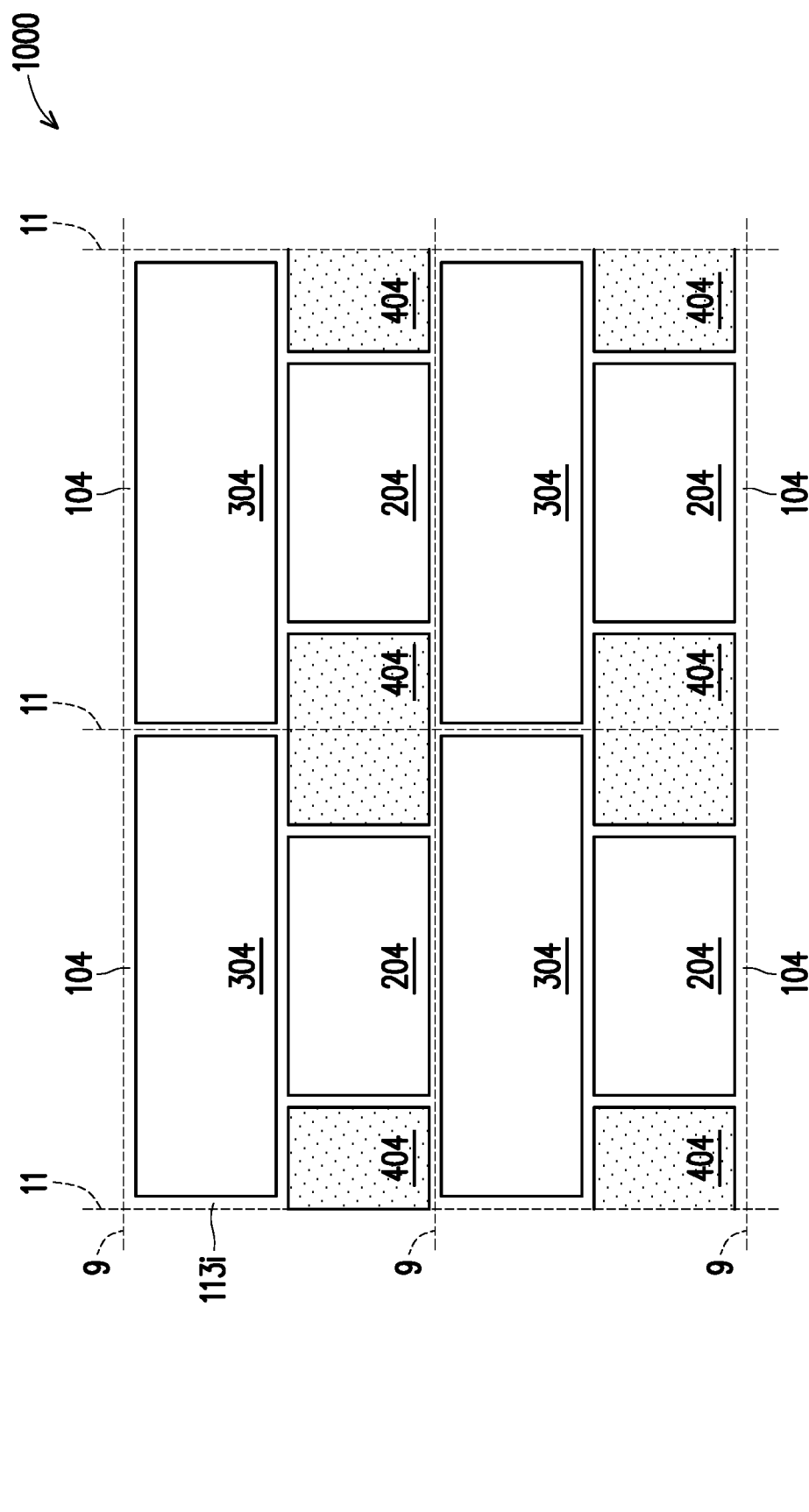

FIG. 2A illustrates a top view of the wafer-level die structure 1000 illustrated in FIG. 1B in accordance with some embodiments. In some embodiments, the wafer 100 is separated into die regions $113_i$ (where i=1, . . . , N, with N being the total number of die regions) by scribe lines 9 and 11. In some embodiments, the scribe lines 9 are perpendicular to the scribe lines 11. In such embodiments, the die regions $113_i$ (where i=1, . . . , N) have shapes of a parallelogram in a top view. In some embodiments, the die regions $113_i$ (where i=1, . . . , N) have rectangular shapes in a top view. In other embodiments, the scribe lines 9 and the scribe lines 11 form angles different from 90 degrees.

Referring to FIG. 2A, the dummy structures 404 are placed in the die regions $113_i$ and overlap with a portion of respective scribe lines 11, such that the dummy structures 404 are shared between a subset of the die regions $113_i$ (where i=1, . . . , N) separated by the respective scribe lines 11. In some embodiments, the dummy structures 404 are placed in an area surrounded by the device dies 204 and 304 and the scribe lines 9 and 11, and extends to neighboring device dies 204. Each scribe line 11 is overlapped by a plurality of disconnected dummy structures 404. The dummy structures 404 have rectangular shapes in a top view, for example.

Figure 3A:
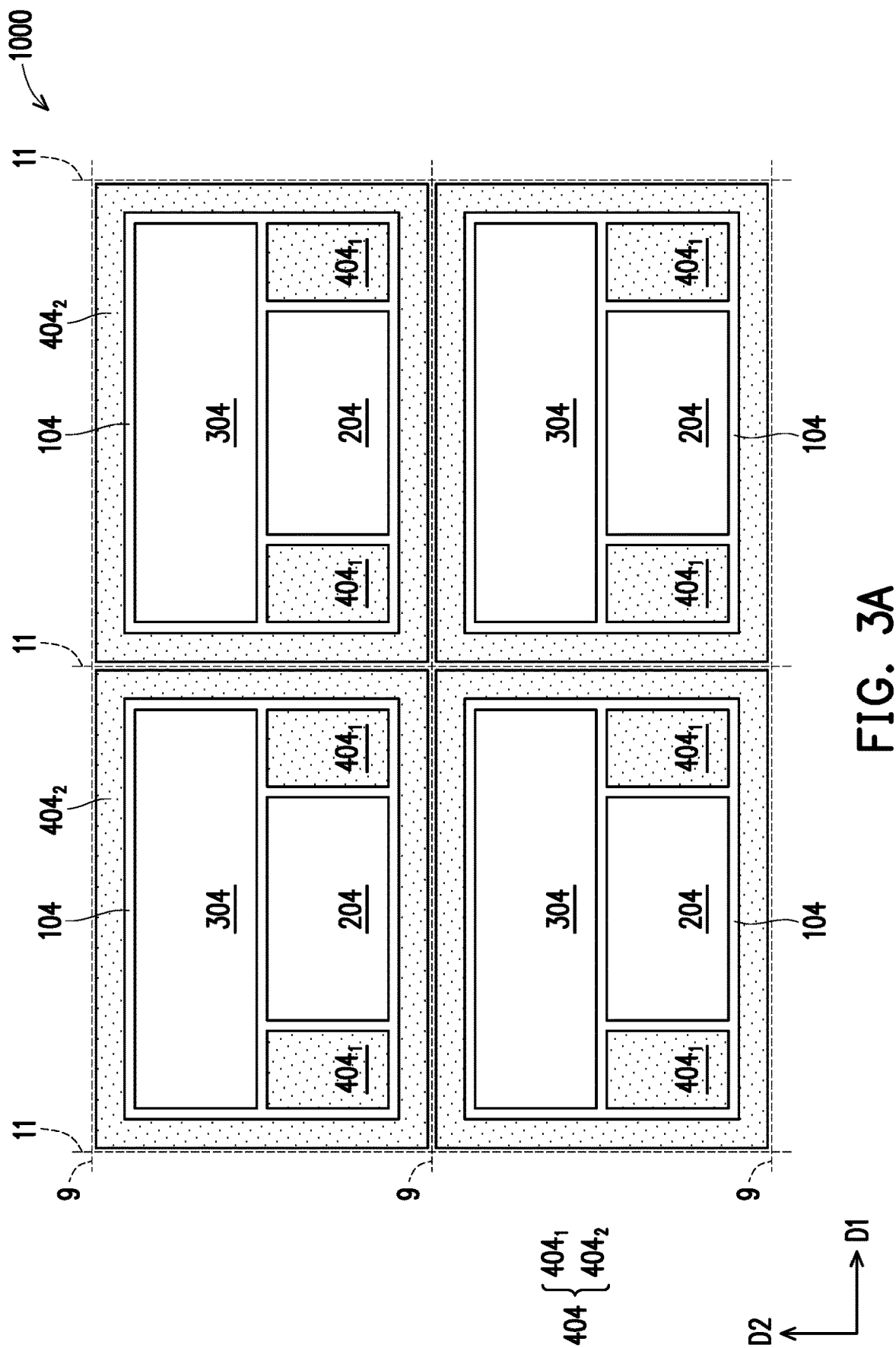

FIG. 3A illustrates a top view of the wafer-level die structure 1000 illustrated in FIG. 1B in accordance with alternative embodiments. In the embedment illustrated in FIG. 3A, the dummy structures 404 includes dummy structures $404_1$ and dummy structures $404_2$ separated from each other. In some embodiments, the dummy structures $404_1$ has rectangular shapes, and the dummy structures $404_2$ have ring shapes in a top view.

The dummy structure $404_2$ is placed around the device dies 204 and 304 and the dummy structure $404_1$ in each die region $113_i$. The dummy structure $404_2$ is placed in the die regions $113_i$ and does not cover the scribe lines 9 and 11. The dummy structures $404_2$ are disposed adjacent to etch other on both sides of the respective scribe lines 9 and 11. The dummy structure $404_1$ is placed in an area surrounded by the device dies 204 and 304 and the dummy structures $404_2$.

Figure 4A:
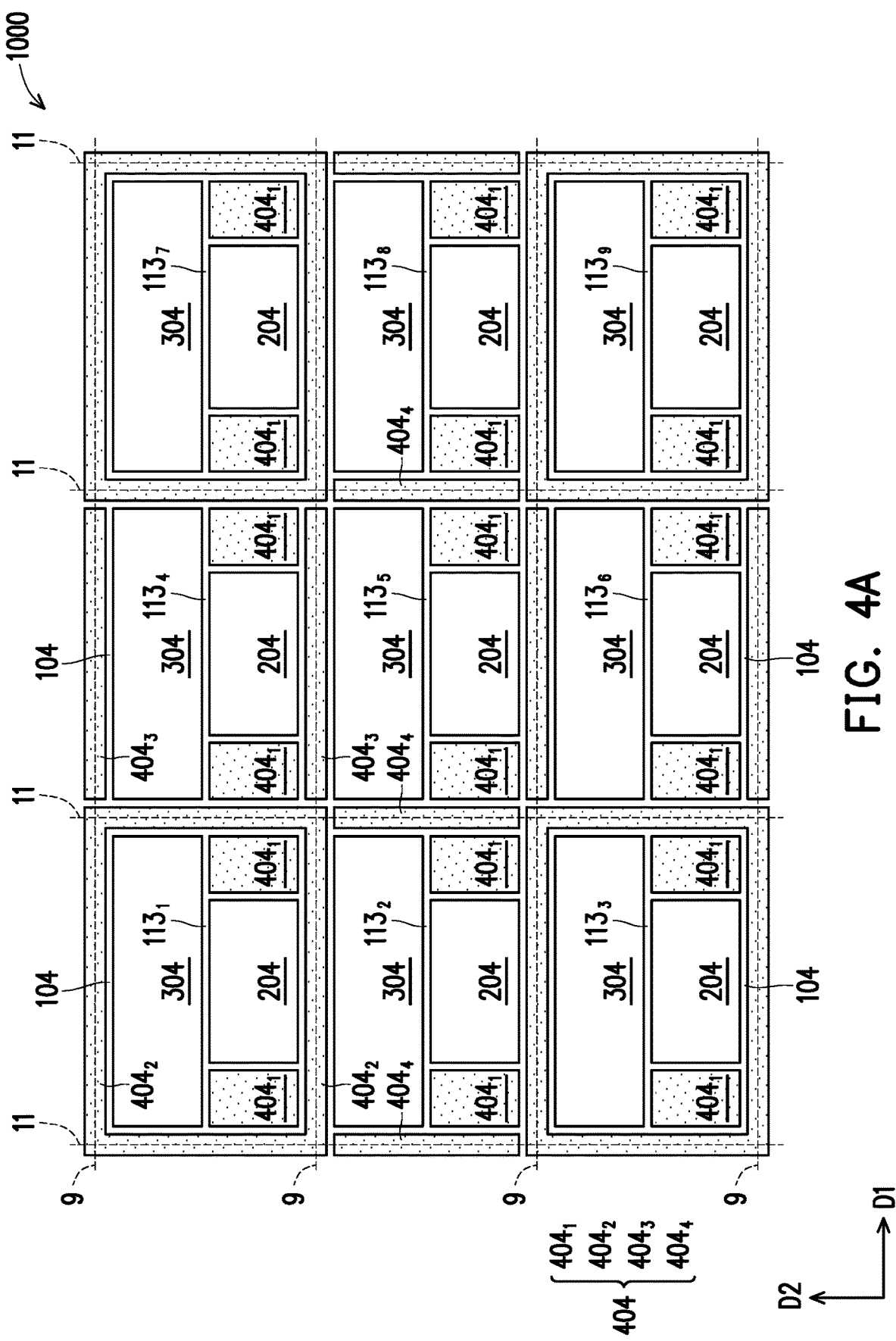
Figure 4C:
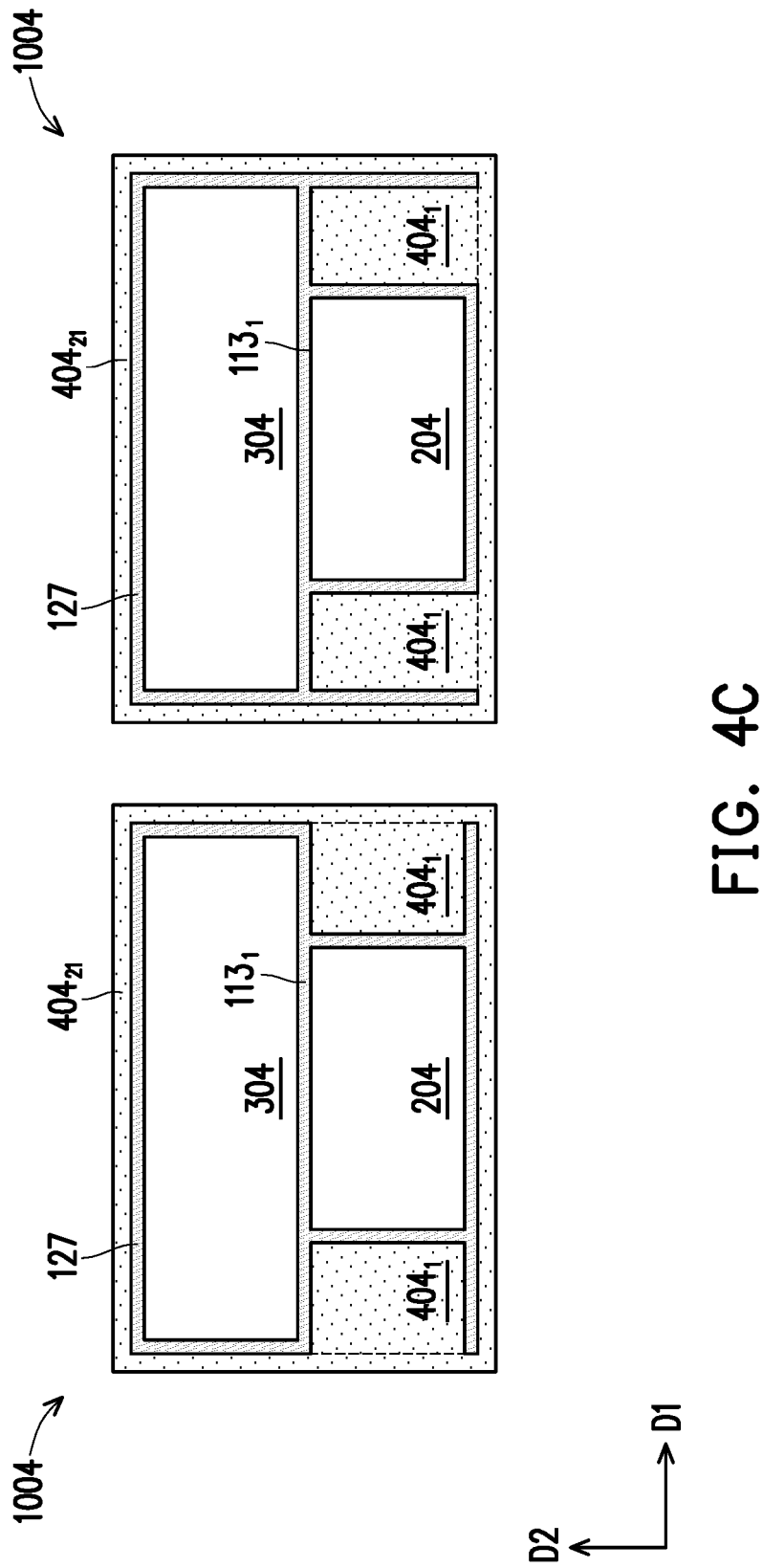
Figure 4D:
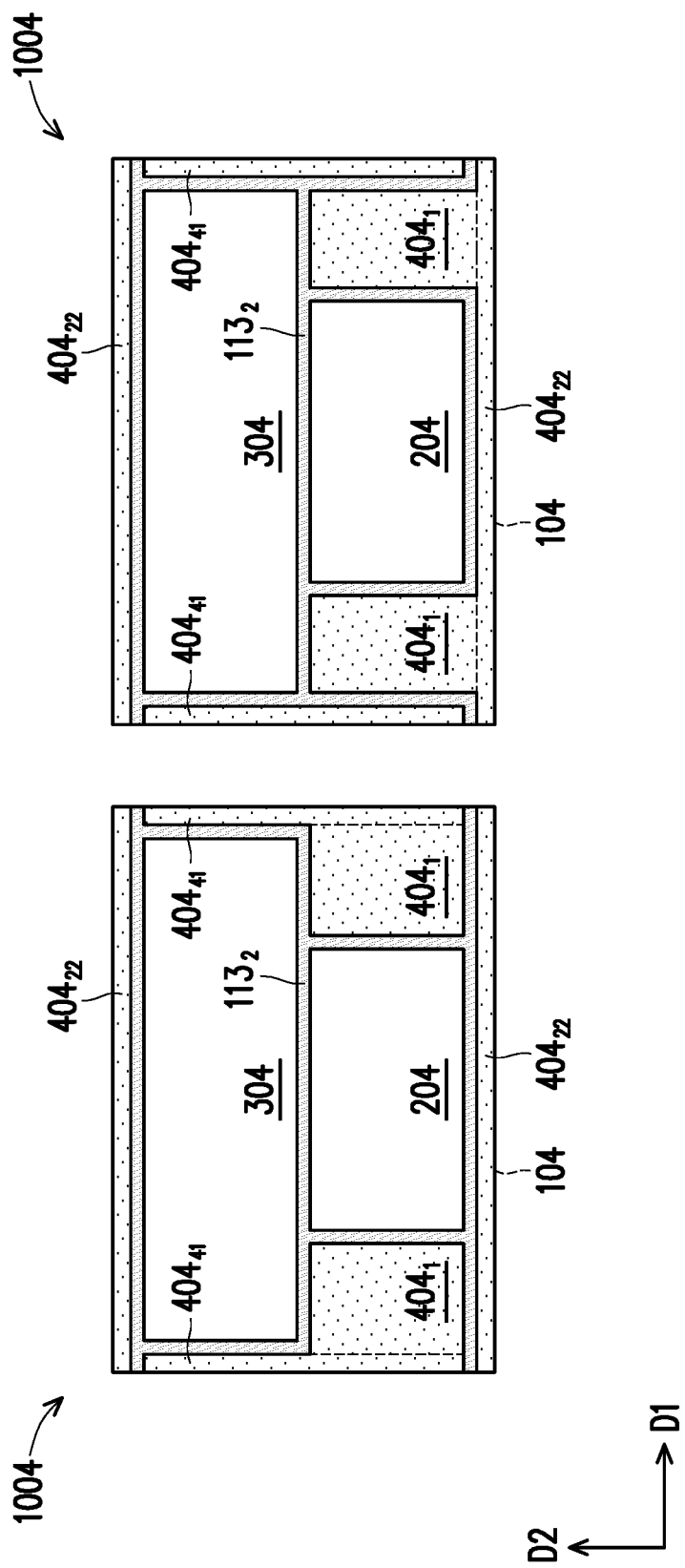
Figure 4E:
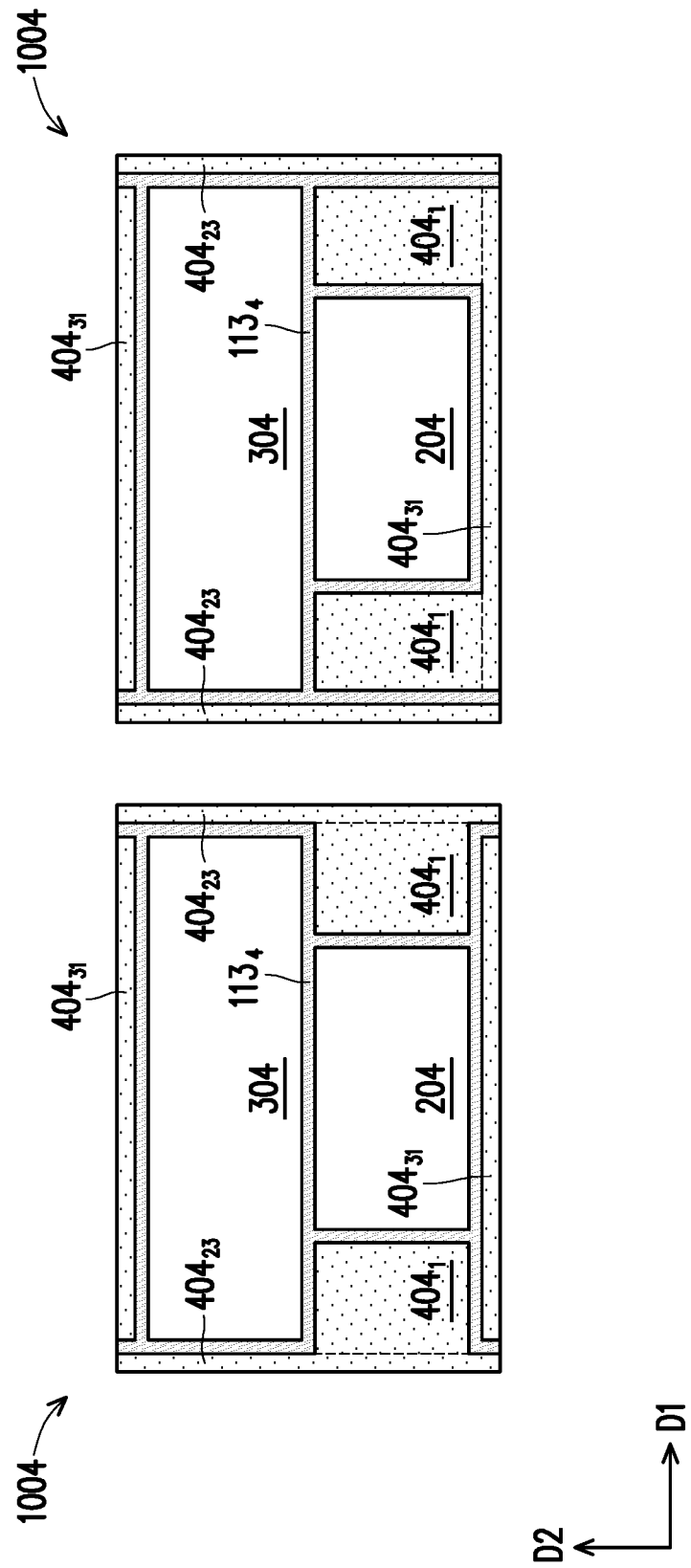
Figure 4F:
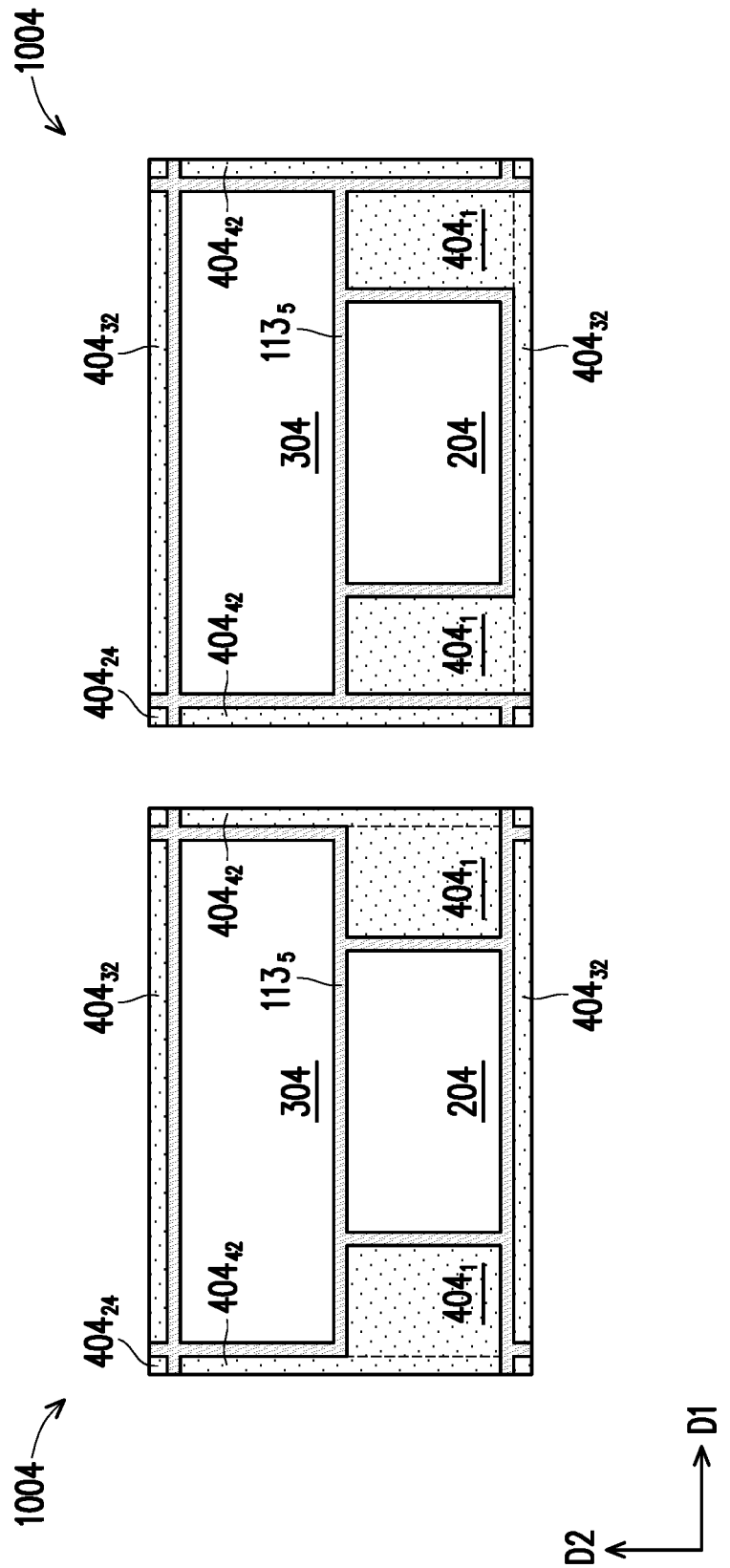

FIG. 4A illustrates a top view of the wafer-level die structure 1000 illustrated in FIG. 1B in accordance with alternative embodiments. In the embedment illustrated in FIG. 4A, the dummy structures 404 includes dummy structures $404_1$, $404_2$, $404_3$ and $404_4$ separated from each other.

In some embodiments, the dummy structures $404_1$, $404_3$ and $404_4$ have rectangular shapes of varying sizes, and the dummy structures $404_2$ have ring shapes in a top view. The dummy structures $404_1$ are similar to the dummy structures $404_1$ of the embodiment illustrated in FIG. 2A, and description is not repeated herein.

The dummy structures $404_2$ are placed around the device dies 204 and 304 and the dummy structure $404_1$ in some of the die regions $113_i$ such as the die regions $113_1$, $113_3$, $113_7$, and $113_9$. The die regions $113_1$ and $113_7$ are separated by the die regions $113_4$ in a first direction D1, and the die regions $113_1$ and $113_3$ are separated by the die regions $113_2$ in a second direction D2.

The dummy structures $404_2$ are placed in the die regions $113_i$ and overlap with a portion of corresponding scribe lines 9 and 11, such that the dummy structures $404_2$ are shared between a subset of the die regions $113_i$ (where i=1, ..., N) separated by the respective scribe lines 9 and 11. For example, the dummy structures $404_2$ is shared by the die regions $113_1$ and $113_4$ (which are separated by the corresponding scribe line 11), and is also shared by the die regions $113_1$ and $113_2$ (which are separated by the corresponding scribe line 9).

In some embodiments, the dummy structures $404_3$ are disposed between adjacent two dummy structures $404_2$ in the first direction D1. The dummy structures $404_3$ may form disconnected dummy structures extending along the first direction D1, and arranged in the second direction D2. The dummy structures $404_3$ are placed in some of the die regions $113_i$ and overlap with a portion of corresponding scribe lines 9, such that the dummy structures $404_3$ are shared between a subset of the die regions $113_i$ (where i=1, ..., N) separated by the respective scribe lines 9.

In some embodiments, the dummy structures $404_4$ are disposed between adjacent two dummy structures $404_2$ in the second direction D2. The dummy structures $404_4$ may form disconnected dummy structures extending along the second direction D2, and arranged in the first direction D1. The dummy structures $404_4$ are formed in some of the die regions $113_i$ and overlap with a portion of corresponding scribe lines 11, such that the dummy structures $404_4$ are shared between a subset of the die regions $113_i$ (where i=1, ..., N) separated by the respective scribe lines 11.

In other words, each scribe line 9 is overlapped by a plurality of dummy structures $404_2$ and a plurality of dummy structures $404_3$, and each scribe line 11 is overlapped by a plurality of dummy structures $404_2$ and a plurality of dummy structures $404_4$.

Figure 5A:
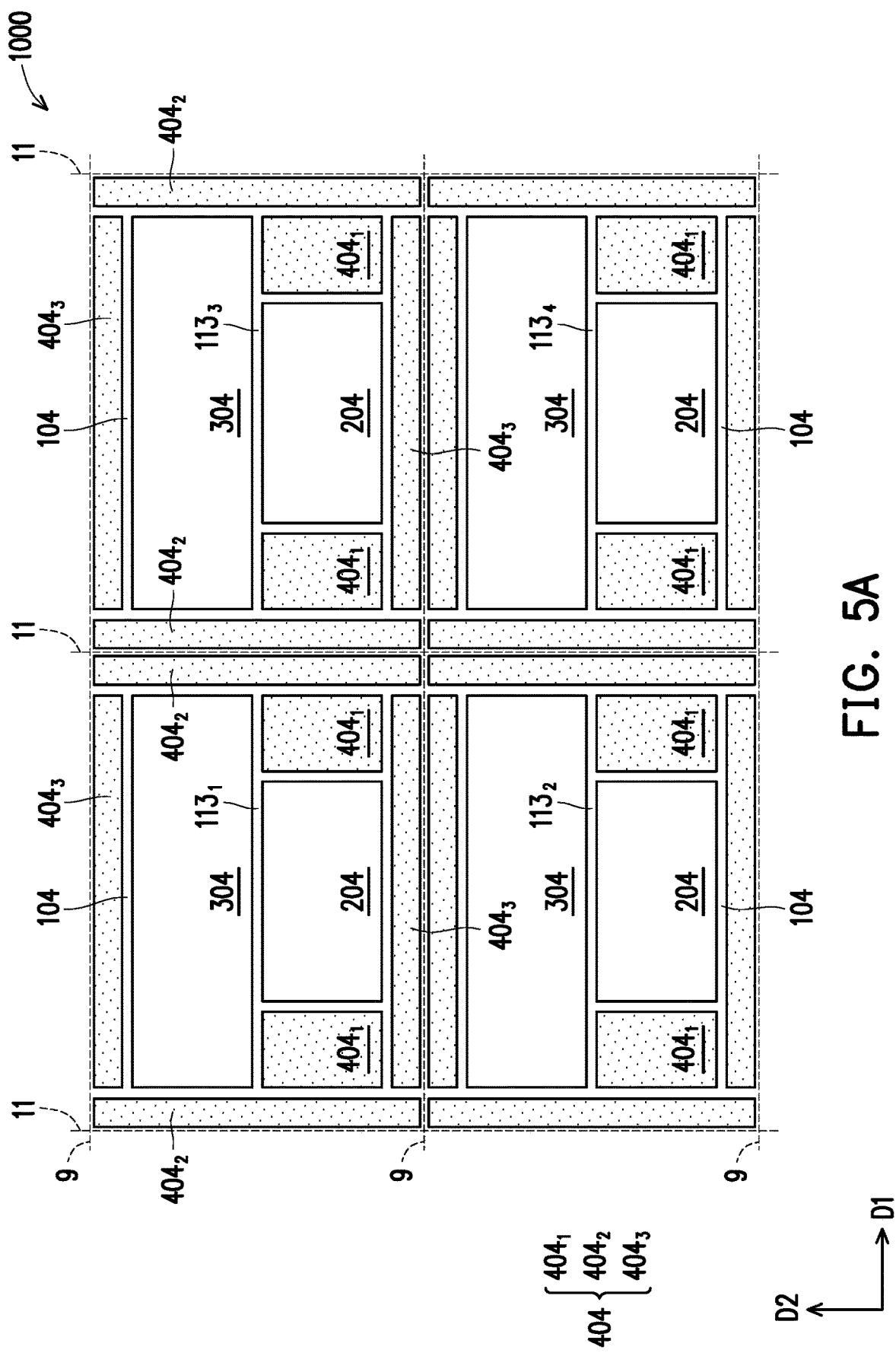

FIG. 5A illustrates a top view of the wafer-level die structure 1000 illustrated in FIG. 1B in accordance with alternative embodiments. In the embedment illustrated in FIG. 5A, the dummy structures 404 includes dummy structures $404_1$, dummy structures $404_2$, and dummy structures $404_3$ separated from each other. The device dies 204 and 304 and the dummy structure $404_1$ are surround by the dummy structures $404_2$ and $404_3$. In some embodiments, the dummy structures $404_1$, $404_2$, and $404_3$ have rectangular shapes in a top view. The dummy structures $404_1$ are similar to the dummy structures $404_1$ of the embodiment illustrated in FIG. 3A, and description is not repeated herein.

The dummy structures $404_2$ may form disconnected dummy structures extending along the second direction D2, and arranged in the first direction D1. The dummy structures $404_2$ are formed in the die regions $113_i$ to overlay corners of the IC dies 104 and expose respective scribe lines 9 and 11. The dummy structures $404_3$ may form disconnected dummy structures extending along the first direction D1, and arranged in the second direction D2. The dummy structures $404_3$ are formed in the die regions $113_i$ and expose respective scribe lines 9 and 11. Two adjacent dummy structures $404_2$ in the first direction are interposed between two adjacent dummy structures $404_3$. The dummy structures $404_2$ in the second direction D2 are adjacent to each other, and the dummy structures $404_3$ are not inserted therebetween.

Figure 6A:
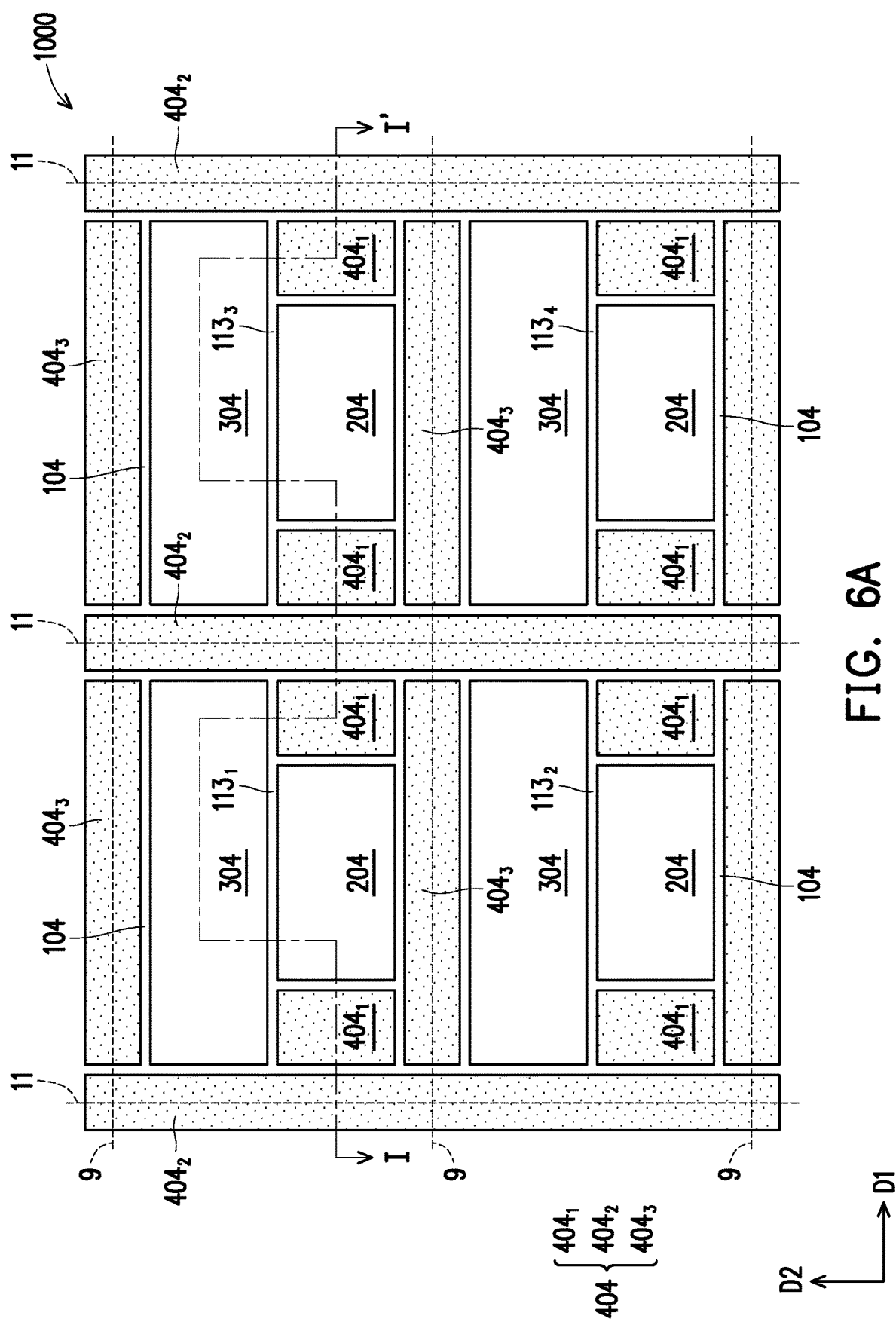

FIG. 6A illustrates a top view of the wafer-level die structure 1000 illustrated in FIG. 1B in accordance with alternative embodiments. FIG. 1B is a cross-sectional view taken along line I-I' of FIG. 6A. In the embedment illustrated in FIG. 6A, the dummy structures 404 includes dummy structures $404_1$, dummy structures $404_2$ and dummy structures $404_3$ separated from each other. In some embodiments, dummy structures $404_1$, $404_2$ and $404_3$ have rectangular shapes of varying sizes in a top view. The dummy structures $404_1$ are similar to the dummy structures $404_1$ of the embodiment illustrated in FIG. 3A, and description is not repeated herein.

The dummy structures $404_2$ are formed in the die regions $113_i$ and overlap with the entirety of respective scribe lines 11, and shared between a subset of the die regions $113_i$ (where i=1, ..., N) separated by the respective scribe lines 11. In some embodiments, the dummy structures $404_2$ may form continuous structures extending along a second direction D2, such that each scribe line 11 is overlapped by a respective single continuous dummy structure $404_2$. In some embodiments, by forming the dummy structures $404_2$ that overlap with the scribe lines 11, a time for forming the individual IC packages may be reduced. For example, the time for forming the individual IC packages may be reduced by a time that would be required to place and bond individual (chip-level or die-level) dummy structures within each die region of the wafer 100 before performing a singulation process. Accordingly, a wafer per hour (WPH) yield may be increased and production cost may be reduced during the production of IC packages.

The dummy structures $404_3$ are formed in the die regions $113_i$ and overlap with a portion of respective scribe lines 9, such that the dummy structures $404_3$ are shared between a subset of the die regions $113_i$ (where i=1, ..., N) separated by the respective scribe lines 9. In some embodiments, the dummy structures $404_3$ may form disconnected dummy structures extending along a first direction D1, such that each scribe line 9 is overlapped by a plurality of dummy structures $404_3$.

The dummy structures 404 being placed in or adjacent to the scribe lines 9 and/or scribe lines 11 may help to prevent warpage during and after singulation (see FIG. 1H) of the packages. One way the dummy structures 404 can help to reduce warpage is to provide support to the package during the actual singulation process. Another way that the dummy structures 404 can prevent warpage is to reduce the coefficient of thermal expansion (CTE) mismatch between the IC dies 104 and the subsequently formed encapsulant 127, if present, (see FIG. 1C) as the dummy structures 404 have a similar CTE to the IC dies 104 and they reduce the amount of encapsulant 127 necessary in the package.

Referring to FIG. 1B, a thinning process is performed to thin the device dies 204 and 304 and the dummy structure 404. In some embodiments, the device dies 204 and 304 and the dummy structure 404 may be thinned using a CMP process, a grinding process, an etching process, a combination thereof, or the like. After the thinning process, the dummy structures 404 have the thickness T1 in a range from 100 μm to 150 μm, for example. The thickness T1 refers to the distance between the frontside surface 404a of the dummy structures 404 to backside surface 404b of the dummy structure 404. For the sake of simplicity, the layers, the pads and elements between the substrate 105 and the insulating layer 119, between the substrate 205 and the insulating layer 219 and between the substrate 305 and the insulating layer 319 are not shown in FIGS. 1C through 1H.

Figure 1C:
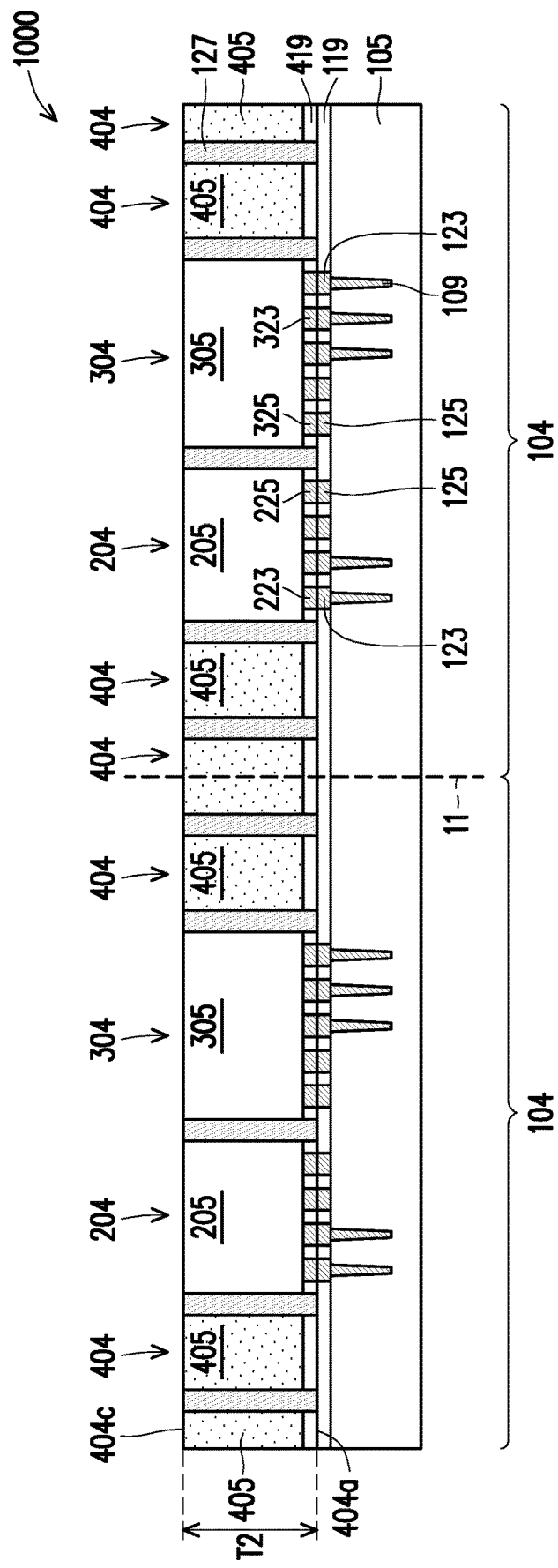

Referring to FIG. 1C, an encapsulant 127 is formed over and surrounding the device dies 204 and 304 and the dummy structure 404. In some embodiments, the encapsulant 127 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the encapsulant 127 may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In other embodiments, the encapsulant 127 may include a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the device dies 204 and 304, and the dummy structure 404.

Referring to FIG. 1C, the encapsulant 127 and device dies 204 and 304, and the dummy structure 404 are planarized, such that backside surfaces of the device dies 204 and 304, and the dummy structure 404 are substantially level or coplanar with a topmost surface of the encapsulant 127. In some embodiments, the planarization process may include a CMP process, a grinding process, an etching process, a combination thereof, or the like. After the planarization process, the dummy structure 404 have the thicknesses T2 in a range from 40 μm to 150 μm, for example. The thickness T2 refers to the distance between the frontside surface 404a of the dummy structures 404 to backside surface 404c of the dummy structure 404.

Figure 1D:
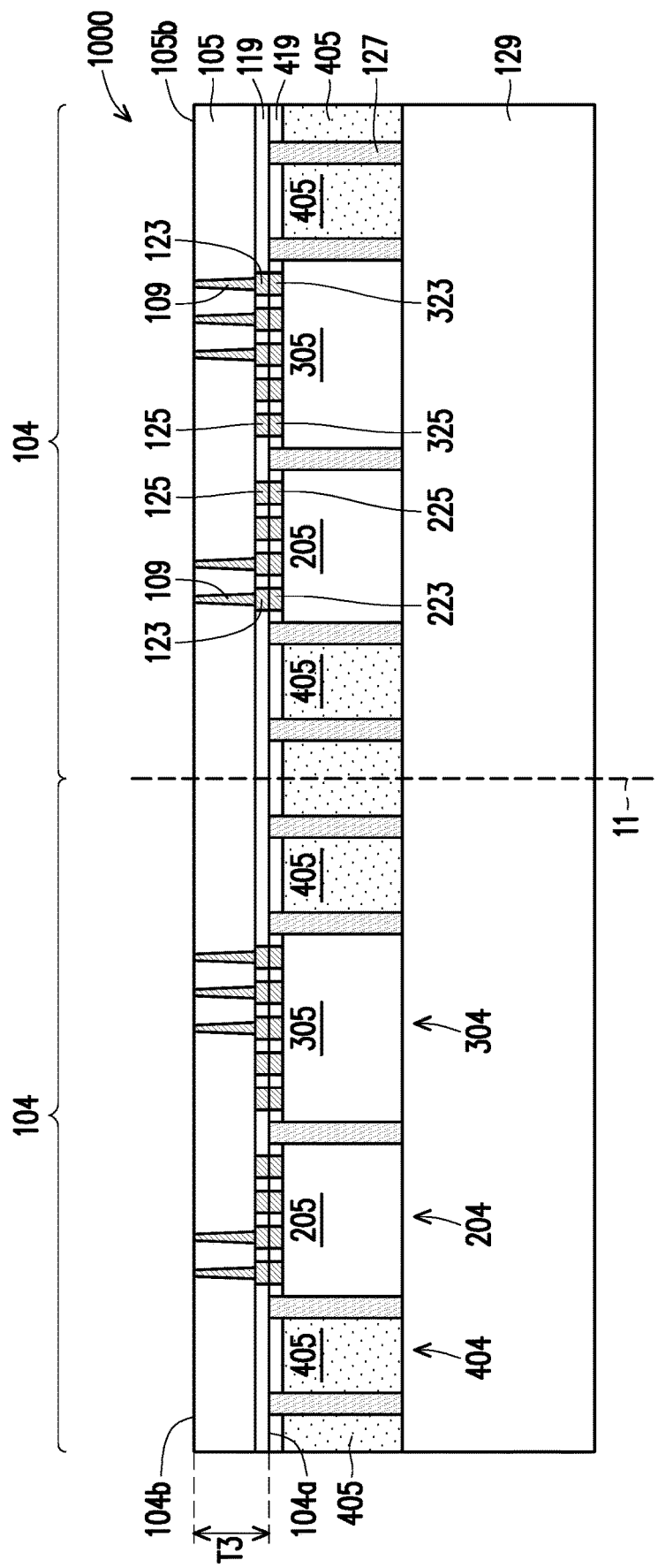

Referring to FIG. 1D, the structure of FIG. 1C is flipped and attached to a carrier 129 through a release layer (not shown). The carrier 129 may include a suitable insulating material such as glass. A thinning process is performed on the back side of the substrate 105 to thin the substrate 105 until TVs 109 are exposed. The thinning process may include an etching process, a grinding process, the like, or a combination thereof. In some embodiment, the thinning process exposes the TVs 109 of the IC dies 104, such that exposed surfaces of the TVs 109 are substantially level or coplanar with backside surfaces 105b of the substrate 105. In some embodiments, after the thinning process, the IC dies 104 have the thickness T3 in a range from 20 μm to 30 μm. The thickness T3 refers to the distance between the frontside surfaces 104a of the IC dies 104 to backside surface 104b of the IC dies 104.

Figure 1E:
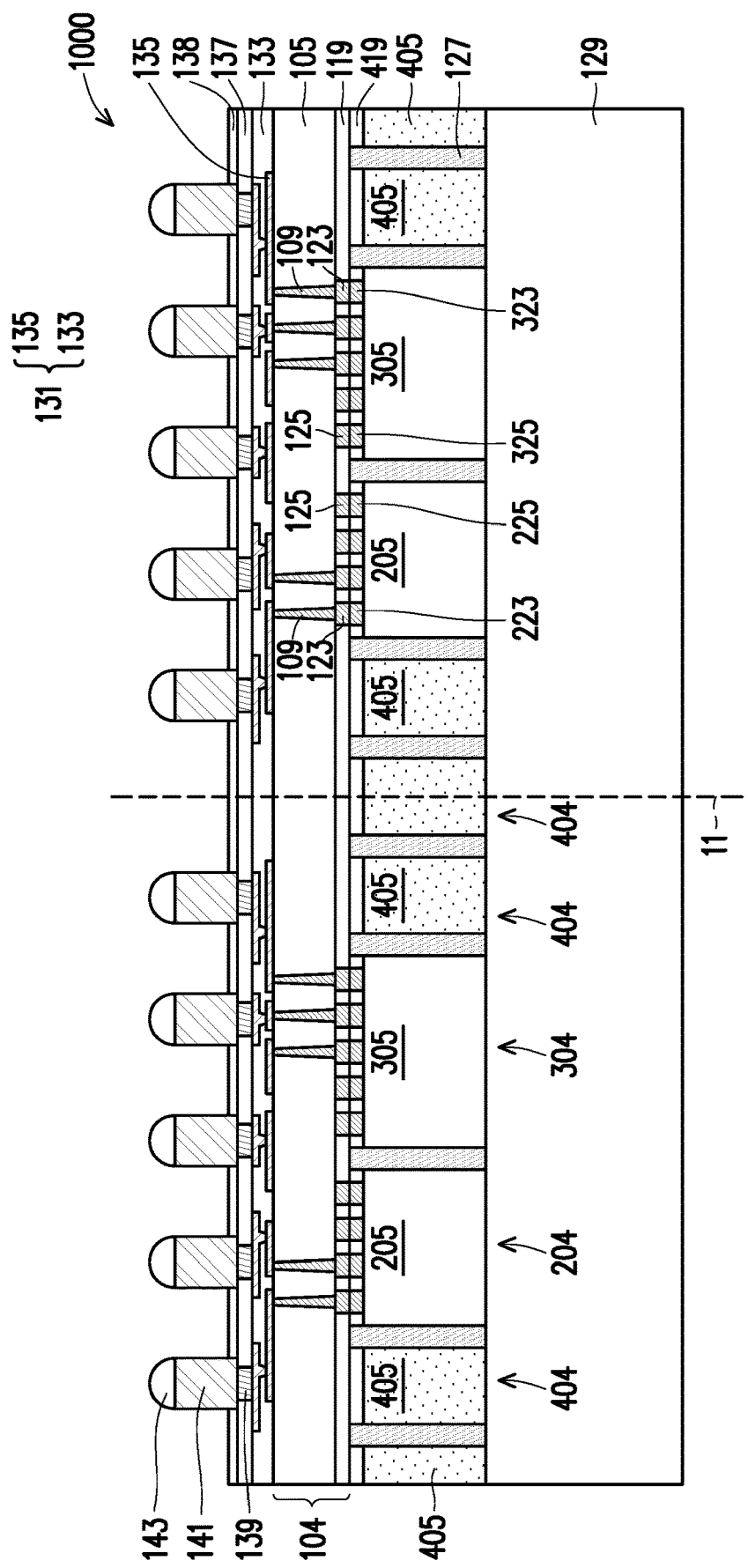

Referring to FIG. 1E, redistribution structure 131 is formed over the backside surface 104b of the IC dies 104, and is used to electrically connect the integrated circuit devices of the IC dies 104, if any, and/or TVs 109 together and/or to external devices. The redistribution structure 131 may include one or more dielectric layer(s) 133 and respective metallization pattern(s) 135 in the one or more dielectric layer(s) 133. The metallization patterns 135 are sometimes referred to as redistribution lines (RDLs). The dielectric layers 133 may include silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 133 may be deposited by any suitable method known in the art, such as spinning, CVD, PECVD, HDP-CVD, or the like. The metallization patterns 135 includes conductive lines and vias. The metallization patterns 135 may be formed in the dielectric layer 133, for example, by using photolithography techniques to deposit and pattern a photoresist material on the dielectric layer 133 to expose portions of the dielectric layer 133 that are to become the metallization pattern 135. An etch process, such as an anisotropic dry etch process, may be used to create recesses and/or openings in the dielectric layer 133 corresponding to the exposed portions of the dielectric layer 133. The recesses and/or openings may be lined with a diffusion barrier layer and filled with a conductive material. The diffusion barrier layer may include one or more layers of TaN, Ta, TiN, Ti, CoW, or the like, deposited by ALD, or the like, and the conductive material may include copper, aluminum, tungsten, silver, and combinations thereof, or the like, deposited by CVD, PVD, or the like. Any excessive diffusion barrier layer and/or conductive material on the dielectric layer may be removed, such as by using a CMP.

A dielectric layer 137 is formed over the redistribution structure 131. The dielectric layer 137 may include a single layer or multi layers. The dielectric layer 137 may include silicon oxide, silicon nitride, silicon oxynitride, USG, TEOS, a polymer, or a combination thereof. The polymer includes a photo-sensitive material such as polybenzoxazole (PBO), polyimide (PI), benzocyclobutene (BCB), a combination thereof or the like. The forming method of the dielectric layer 137 include suitable fabrication techniques such as spin coating, chemical vapor deposition (CVD), plasma-enhanced chemical vapor deposition (PECVD), lamination or the like.

Thereafter, a plurality of openings (not shown) are formed in the dielectric layer 137 to expose portions of the top surface of the redistribution structure 131. The forming method of the openings may include photolithography and etching processes, a laser drilling process, or a combination thereof.

A plurality of conductive pads (UBMs) 139 are formed in the openings 36 and on the RDL 34. The conductive pads 139 may be formed of metal or metal alloy, such as aluminum, copper, nickel, or alloys thereof, and may be formed by a dual-damascene process, PVD, electroplating, or a combination thereof. The conductive pad 139 penetrates through the dielectric layer 137 to be in electrical contact with the top surface of the redistribution structure 131. In some embodiments, the top surfaces of the conductive pads 139 are substantially coplanar with the top surface of the dielectric layer 137, but the disclosure is not limited thereto. In some other embodiments, the conductive pads 139 protrude from and extend across the top surface the dielectric layer 137.

The conductive pad 139 may include a seed layer and a conductive material (not shown). In some embodiments, the seed layer includes a titanium layer and a copper layer over the titanium layer formed using, for example, PVD or the like. A conductive material is formed over the seed layer. The conductive material may be formed by plating, such as electroplating or electroless plating, or the like. The conductive material may include a metal, like copper, titanium, tungsten, aluminum, or the like.

Electrical connectors 141 are formed on the conductive pads (UBMs) 139 and are electrically coupled to TVs 109 through the redistribution structure 131. The electrical connectors 141 may be referred to as die connectors 141. The electrical connectors 141 are formed at the top surface of the redistribution structure 131. In some embodiments, the electrical connectors 141 are solder balls and/or bumps, such as ball grid array (BGA) balls, C4 micro bumps, ENIG formed bumps, ENEPIG formed bumps, or the like. The electrical connectors 141 may include a conductive material such as solder, copper, aluminum, gold, nickel, silver, palladium, tin, the like, or a combination thereof. In some embodiments, the electrical connectors 141 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

In another embodiment, the electrical connectors 141 are metal pillars (such as a copper pillar) formed by a sputtering, printing, electro plating, electroless plating, CVD, or the like. The metal pillars may be solder free and have substantially vertical sidewalls. In some embodiments, conductive caps 143 are formed on the top of the electrical connectors 141. The conductive caps 143 may include nickel, tin, tin-lead, gold, silver, palladium, indium, nickel-palladium-gold, nickel-gold, the like, or a combination thereof and may be formed by a plating process.

In some embodiments, an insulating layer 138 may be formed on the dielectric layer 137 before forming the electrical connectors 141 on the conductive pads (UBMs) 139. The insulating layer 138 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the insulating layer 145 may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. Thereafter, a plurality of openings (not shown) are formed in the insulating layer 138 to expose portions of the conductive pads (UBMs) 139, and then the electrical connectors 141 are formed in the openings. The forming method of the openings may include photolithography and etching processes, a laser drilling process, or a combination thereof.

Figure 1F:
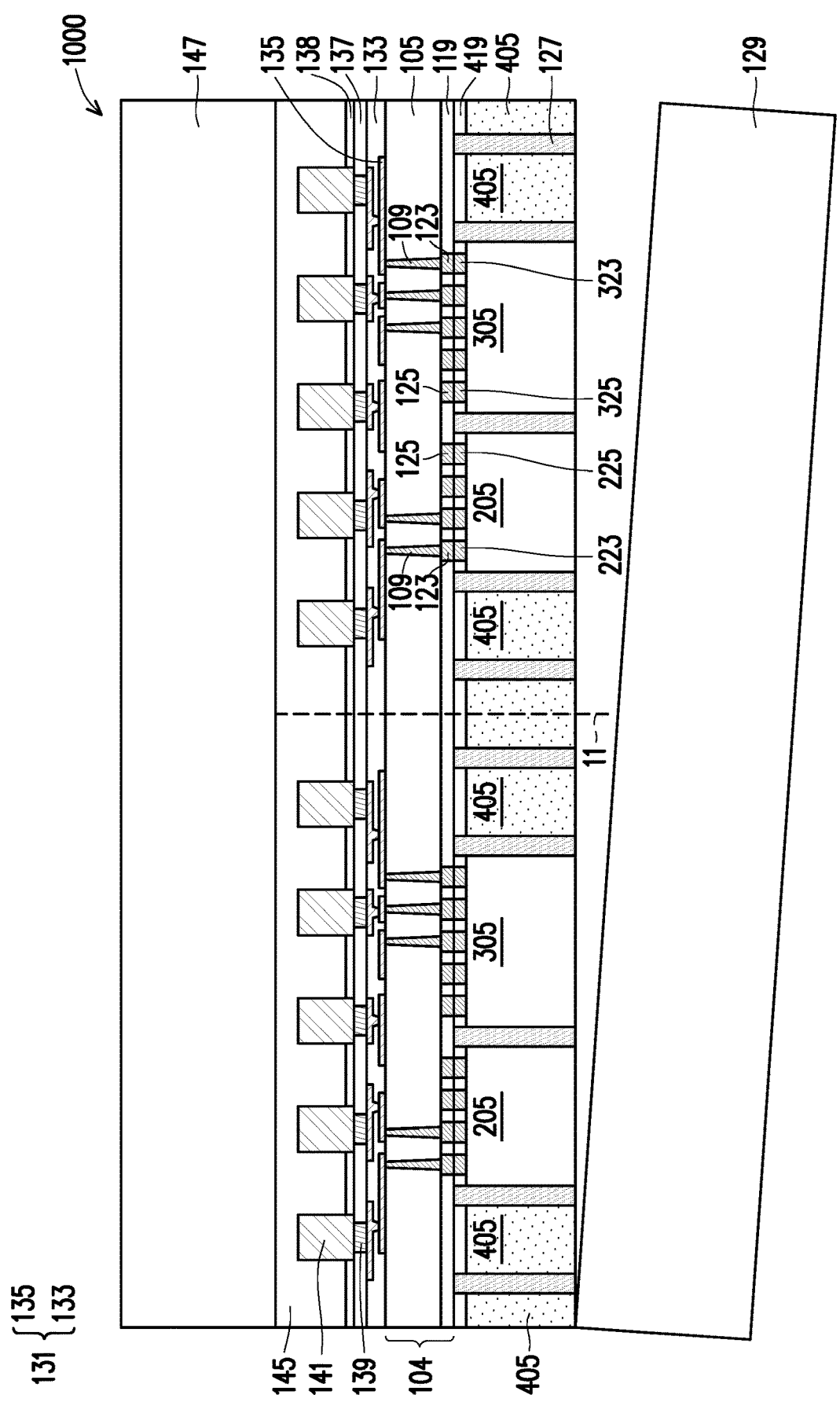

Referring to FIG. 1F, then a chip-probing process or other suitable chip testing process is performed on the wafer 1000 to identify known good dies and bad dies. The conductive caps 143 are removed after the chip-probing process. Thereafter, an insulating layer 145 is formed on the electrical connectors 141 and the redistribution structure 131. In some embodiments, the insulating layer 145 and the insulating layer 138 may include a same material or different materials. In some embodiments, the insulating layer 145 is planarized using a CMP process, a grinding process, an etching process, a combination thereof, or the like.

Thereafter, the wafer 1000 is attached to a carrier 147, and then a carrier de-bonding is performed to detach (or "de-bond") the carrier 129 from the wafer 1000.

Figure 1G:
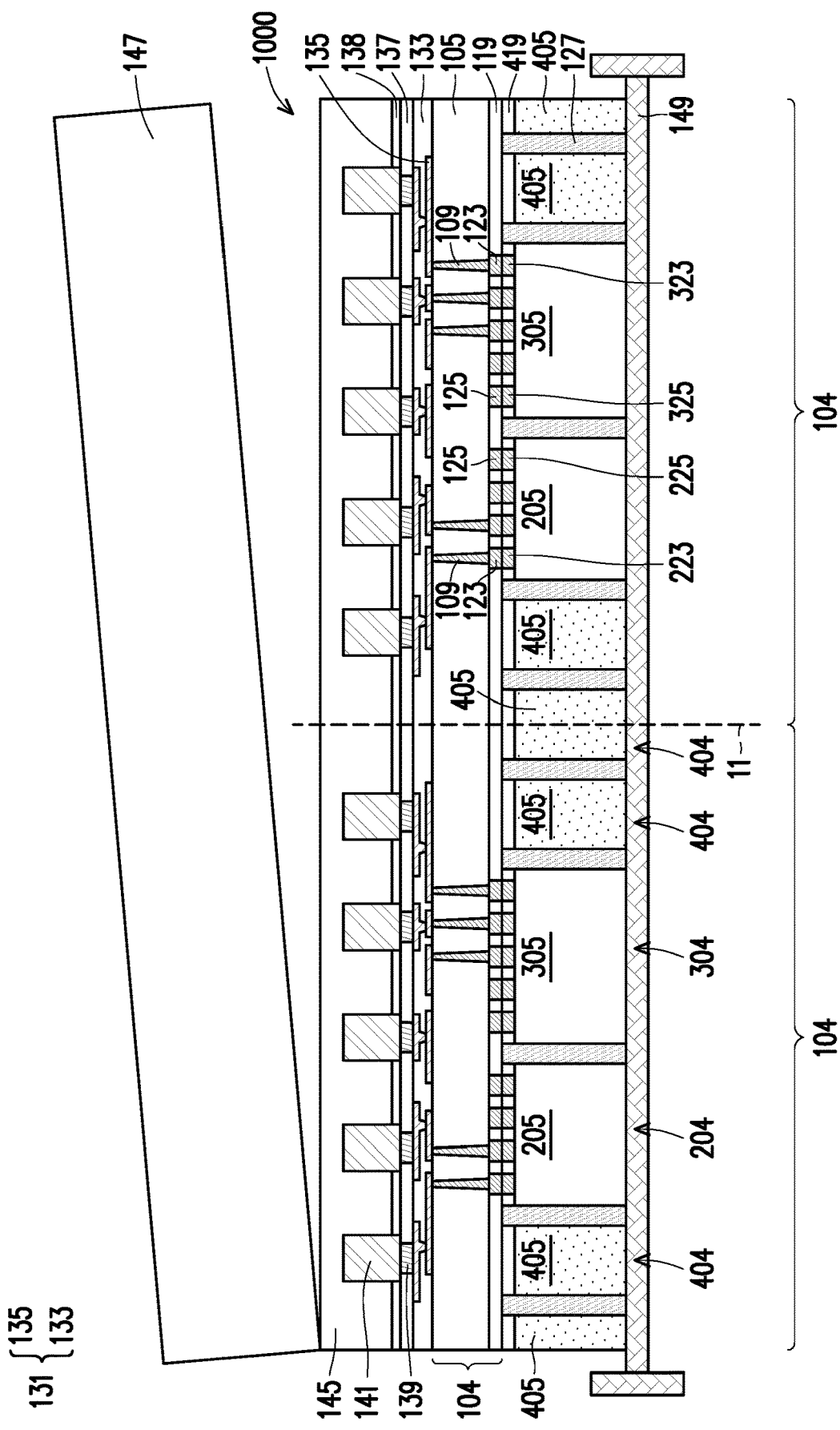
Figure 1H:
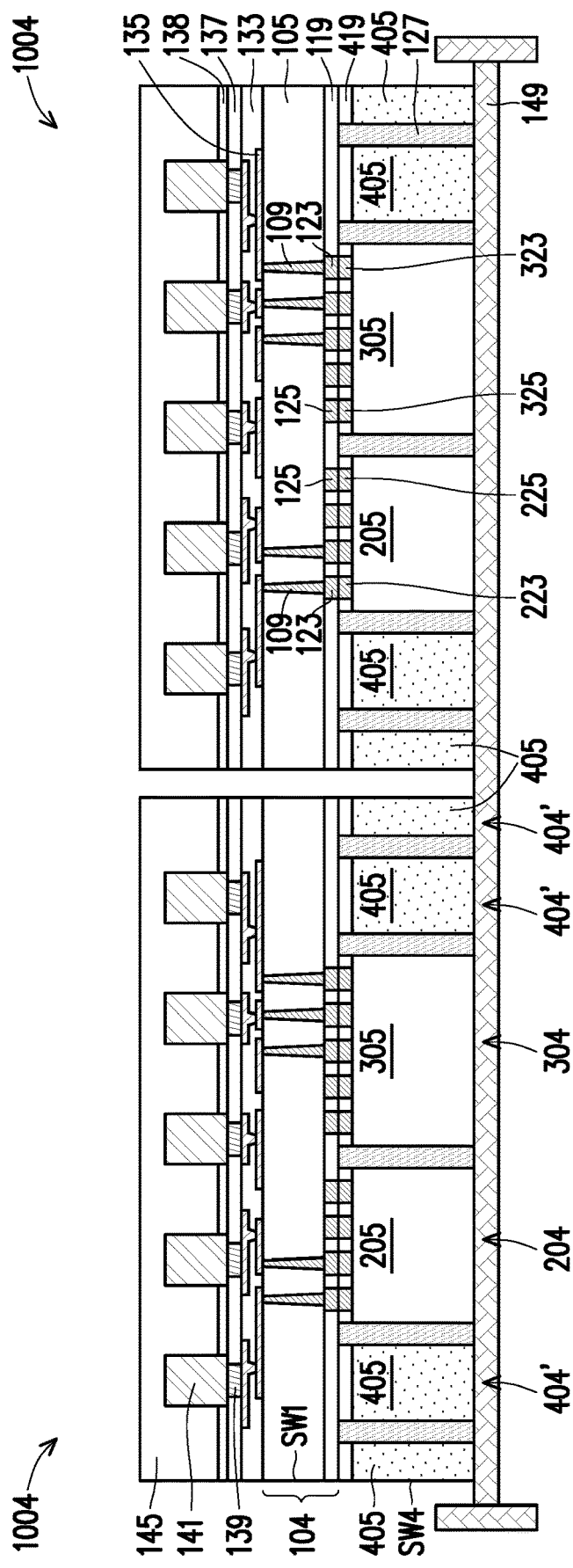

Referring to FIGS. 1G and 1H, the wafer 1000 is attached to a frame 149, and then the carrier 147 is removed from the wafer 1000. The wafer 1000 is singulated along the scribe lines 9 and 11 (see FIGS. 2A to 6A) to form individual 3DIC structures 1004. The respective process is illustrated as step S30 in the process flow shown in FIG. 8. In some embodiments, the wafer 1000 may be singulated into individual 3DIC structures (or referred to as stacked structures) 1004, for example, by sawing, laser ablation, etching, a combination thereof, or the like.

Referring to FIG. 1H, such the singulation process also singulates the dummy structures 404 and forms individual (chip-level or die-level) dummy structures 404' for respective 3DIC structures 1004. Each 3DICstructure 1004 includes the IC die 104, the device dies 204 and 304, and dummy structures 404' aside the device die 204 and/or the device die 304. The 3DICstructure 1004 further includes the encapsulate 127 encapsulates the device dies 204 and 304. Sidewall SW4 of the dummy structure 404' is aligned with a sidewall SW1 of the IC die 104. The sidewall SW4 of the dummy structure 404' is substantially level or coplanar with the sidewall SW1 of the IC die 104.

As discussed above, the dummy structures 404 can reduce the coefficient of thermal expansion (CTE) mismatch between the IC dies 104 and the encapsulant 127 as the dummy structures 404 have a similar CTE to the IC dies 104 and they reduce the volume of encapsulant 127 necessary in the package. Therefore, the dummy structures 404' help to reduce the stress and warpage caused by the thick encapsulant on the IC dies 104, and mitigate the IC die 104 sidewall crack concern. In some embodiments, the ratio of a sum of areas of the device dies 204 and 304 and the dummy structures 404' to an area of the IC die 104 is greater than 75%, the ratio of an area of the encapsulate 127 to the area of the IC die 104 is less than 25%. For example, the ratio of the sum of areas of the device dies 204 and 304 and the dummy structures 404' to the area of the IC die 104 ranges from 75% to 99%, and the ratio of the area of the encapsulate 127 to the area of the IC die 104 ranges from 1% to 25%.

Figure 2B:
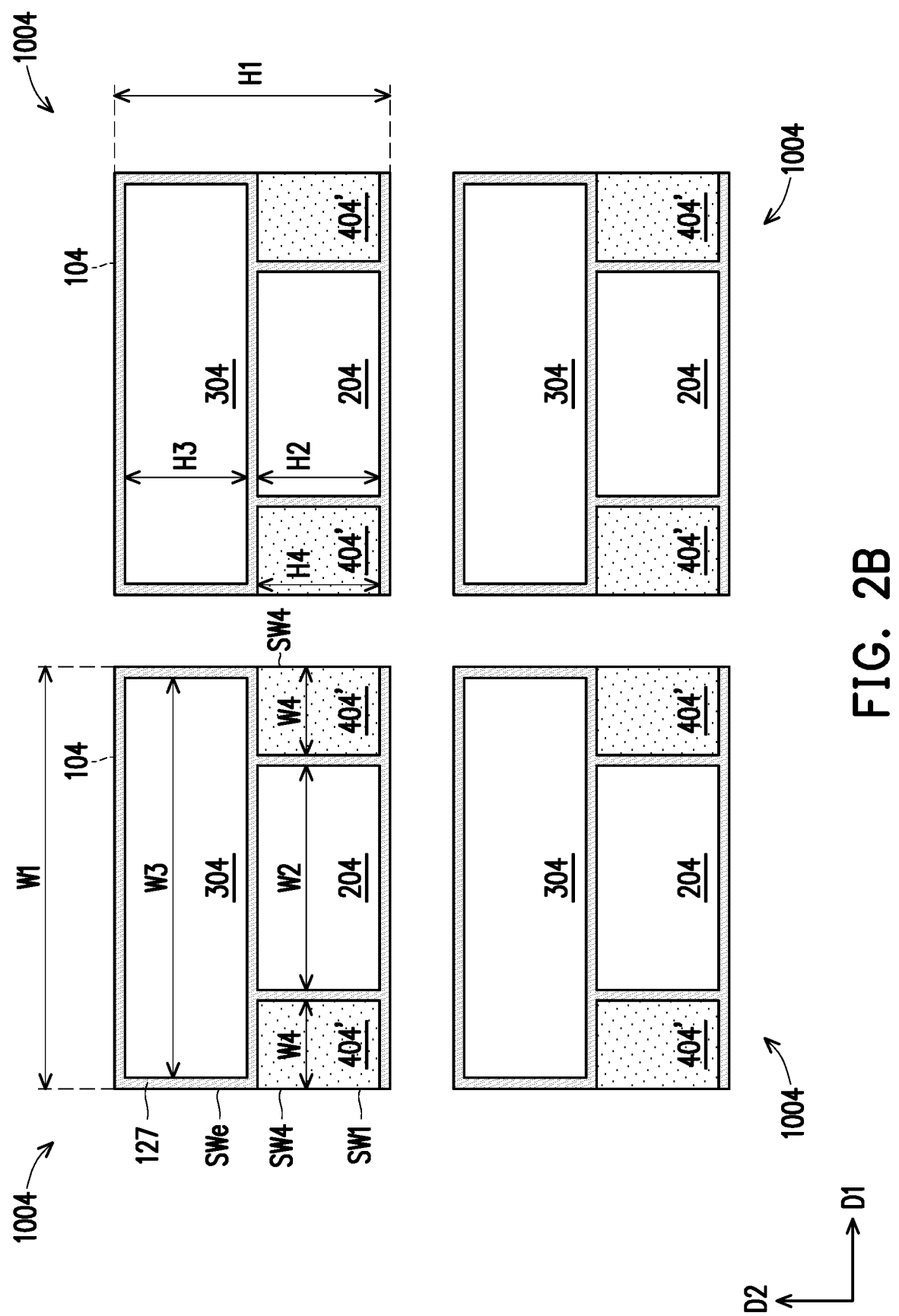

FIG. 2B illustrates a top view of the individual 3DIC structures 1004 singulated from the wafer-level die structure 1000 illustrated in FIG. 2A in accordance with some embodiments. Such the singulation process also singulates the dummy structures 404 and forms individual (chip-level or die-level) dummy structures 404' for respective 3DIC structures 1004. Each 3DIC structure 1004 includes the IC die 104, the device dies 204 and 304 and two dummy structures 404' on the IC die 104.

Each dummy structure 404' has the length W4 along a first direction D1 and the length H4 along a second direction D1. The first direction D1 is perpendicular to the second direction D2. The length H4 of the dummy structures 404' is less than the length H1 of the IC die 104. The length H4 of the dummy structures 404' may be equal to, greater than or less than the length H2 of the device die 204. In some embodiments, the ratio R2 (R2=H4/ΔH) of the length H4 to the difference (ΔH=|H3−H2|, absolute value) between the lengths H3 and H2 is greater than 10%, 100%, 200%, 300% or 400%. For example, the ratio R2 ranges from 500% to 10%.

The length W1 of the IC die 104 is greater than the length W3 of the device die 304. The length W3 of the device die 304 is greater than the length W2 of the device die 204. The dummy structures 404' are disposed aside the device die 204.

The length W4 of the dummy structure 404' is smaller than the length W3 of the device die 304. The length W4 of the dummy structure 404' may be equal to, greater than or less than the length W2 of the device die 204. In some embodiments, the ratio R1 (R1=W4/ΔW) of the length W4 to the difference (ΔW=W3−W2) between the length W3 and W2 is greater than 10%, 50%, 70%, 100%, 200%, 300% or 400%. For example, the ratio R1 ranges from 500% to 10%.

Four sidewalls of the dies 204 and four sidewalls of the device die 304 are surround by the encapsulant 127. The dummy structures 404' are partially surround by the encapsulant 127. In some embodiments, three sidewalls of each dummy structure 404' are surround by the encapsulant 127, and one sidewall SW4 of each dummy structure 404' is exposed by the encapsulant 127. The sidewall SW4 of the dummy structure 404' is aligned with a sidewall SW1 of the IC die 104 and a sidewall SWe of the encapsulant 127 aside the device die 304. The sidewall SW4 of the dummy structure 404' is substantially level or coplanar with the sidewall SW1 of the IC die 104 and the sidewall SWe of the encapsulant 127 aside the device die 304.

Figure 3B:
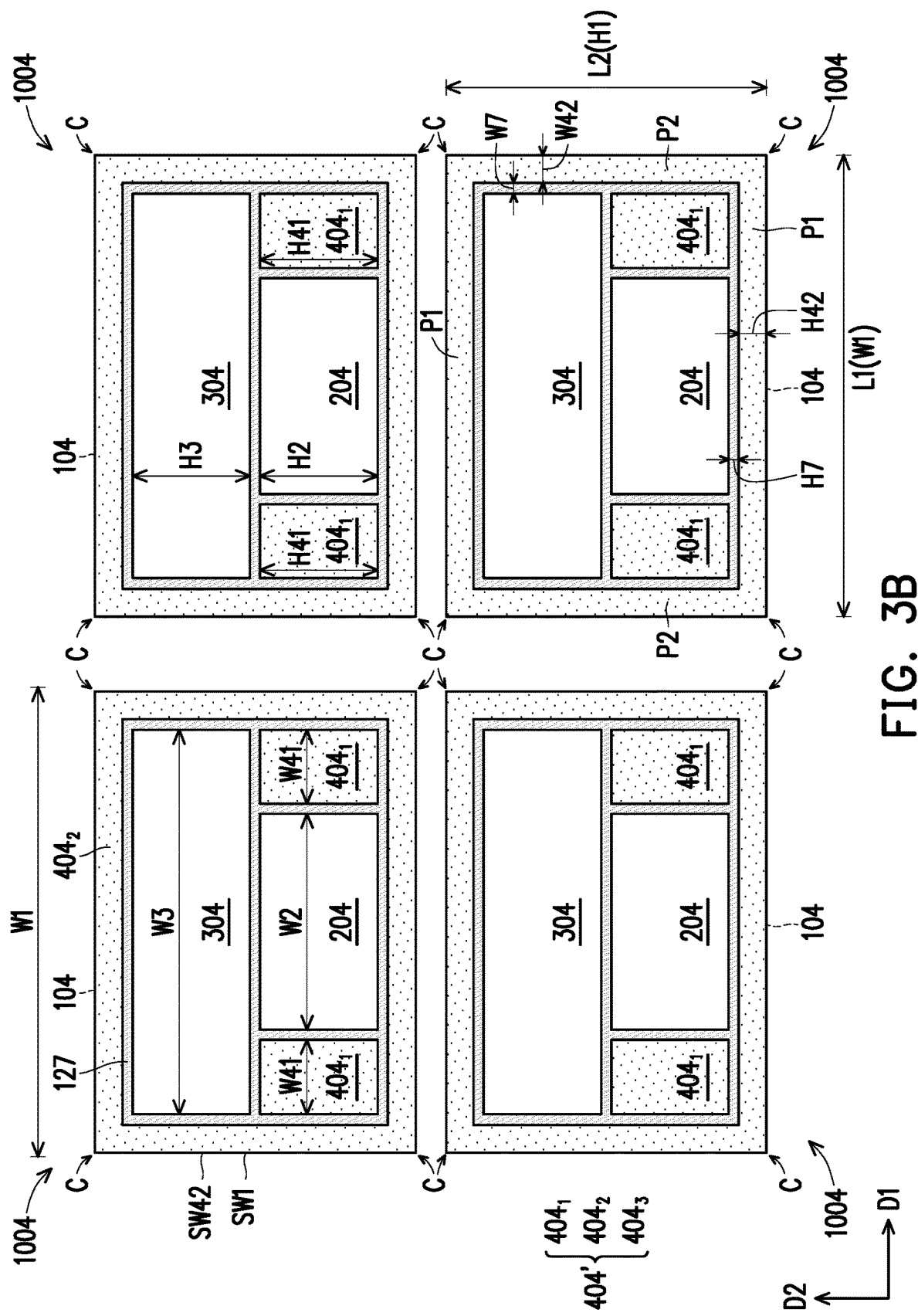
Figure 3C:
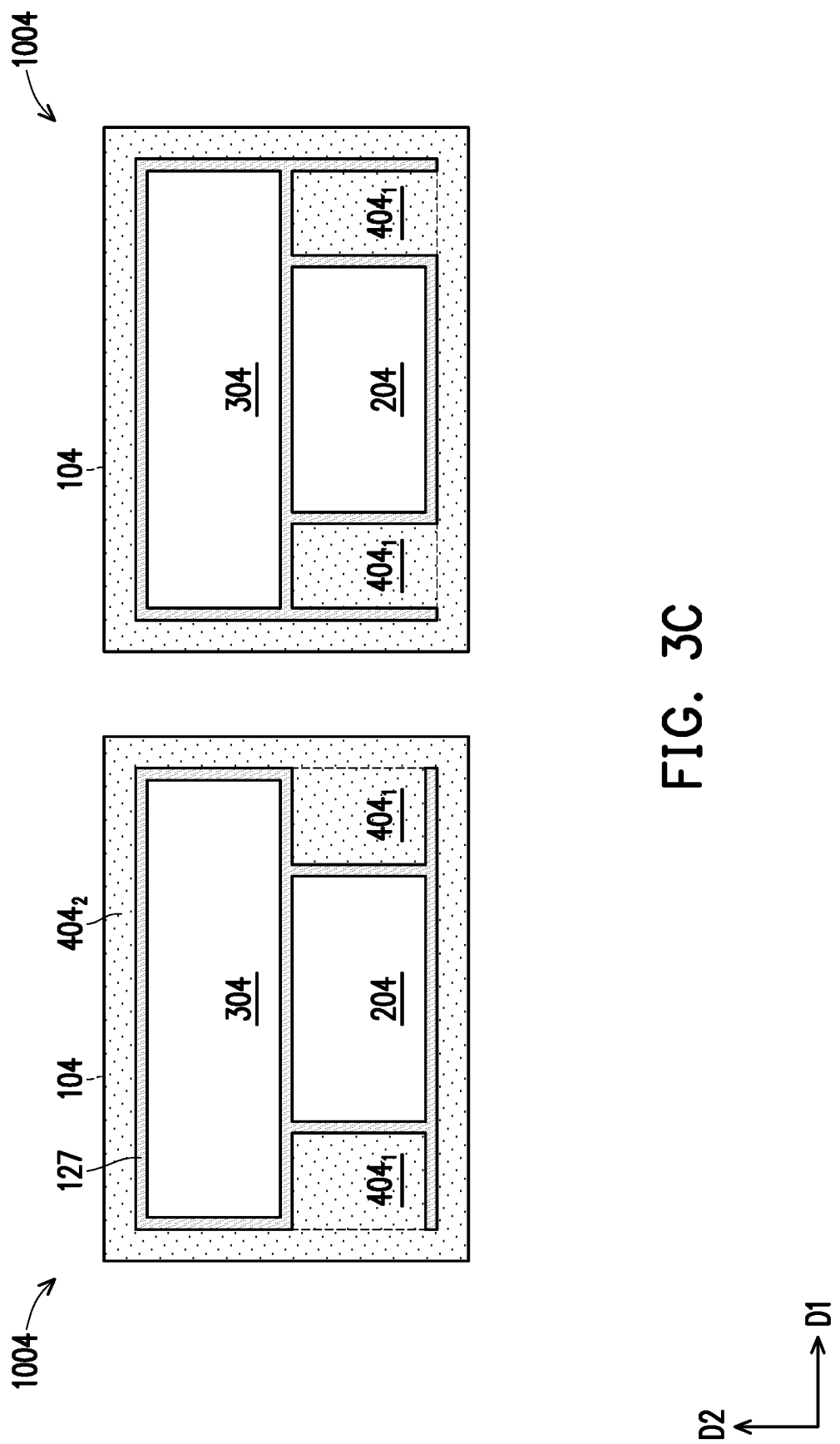
FIGS. 3C, 4C, 4D, 4E, 4F, 5C and 6C illustrate top views of the individual 3DIC structures in accordance with some other embodiments.

FIG. 3B illustrates a top view of the individual 3DIC structures 1004 singulated from the wafer-level die structure 1000 illustrated in FIG. 3A in accordance with some embodiments. After the wafer-level die structure 1000 is singulated along the scribe lines 9 and 11, the dummy structures $404_1$, and $404_2$ are remained in the individual 3DIC structures 1004. Each 3DIC structure 1004 includes the IC die 104, and the device dies 204 and 304, two dummy structures $404_1$, and one dummy structure $404_2$ on the IC die 104. The dummy structures $404_1$ and $404_2$ are separated from each other. In some embodiments, the dummy structures $404_1$ has rectangular shapes, and the dummy structure $404_2$ has a rectangular ring shape in a top view.

The dummy structures $404_1$ are disposed aside the device die 204. Each dummy structure $404_1$ has the length W41 along a first direction D1 and the length H41 along a second direction D1. The first direction D1 is perpendicular to the second direction D2. The length H41 of the dummy structures $404_1$ is less than the length H1 of the IC die 104. The length H41 of the dummy structures $404_1$ may be equal to, greater than or less than the length H2 of the device die 204. In some embodiments, the ratio R12 (R12=H41/ΔH) of the length H41 to the difference (ΔH=H3−H2) between the length H3 and the length H2 is greater than 10%. For example, the ratio R12 ranges from 10% to 500%.

The length W1 of the IC die 104 is greater than the length W3 of the device die 304. The length W3 of the device die 204 is greater than the length W2 of the device die 204. The length W41 of the dummy structure $404_1$ is smaller than the length W3 of the device die 304. The length W41 of the dummy structure $404_1$ may be equal to, greater than or less than the length W2 of the device die 204. In some embodiments, the ratio R11 (R11=W4/ΔW) of the length W41 to the difference (ΔW=W3−W2) between the length W3 and W2 is greater than 10%. For example, the ratio R11 ranges from 10% to 500%.

The dummy structure $404_2$ surrounds the device dies 204 and 304 and the dummy structures $404_1$. The dummy structure $404_2$ includes two parts P1, and two parts P2. Each part P1 has the length L1 along the first direction D1, and each part P2 has the length L2 along the second direction D2. The first direction D1 is perpendicular to the second direction D2. In some embodiments, the length L1 of the parts P1 of the dummy structures $404_2$ may be equal to the length W1 of the IC die 104, and the length L2 of the parts P2 of the dummy structures $404_2$ may be equal to the length H1 of the IC die 104.

Each part P1 has the width H42, and each parts P2 of the dummy structures $404_2$ has the width W42. In some embodiments, the width H42 of the part P1 of the dummy structures $404_2$ is greater than the width H7 of the encapsulate 127 between the dummy structures $404_2$ and the device die 204. The width W42 of the part P2 of the dummy structures $404_2$ is greater than the width W7 of the encapsulate 127 between the dummy structures $404_2$ and device die 304. The width W42 may be the same as or different from the width H42.

The encapsulant 127 is filled within the dummy structure $404_2$. Four sidewalls of the dies 204, four sidewalls of the device die 304 and four sidewalls of the dummy structures $404_1$ are surround by the encapsulant 127. The encapsulant 127 and an encapsulant 142 in subsequent process (see FIG. 7C) are separated by the dummy structure $404_2$.

In some embodiments, the four sidewalls SW42 of the dummy structures $404_2$ are aligned with the four sidewalls SW1 of the IC die 104 respectively. The four sidewalls SW42 of the dummy structure $404_2$ are substantially level or coplanar with the four sidewalls SW1 of the IC die 104 respectively. In addition, four corners C of the IC die 104 of the respective 3DIC structures 1004 are covered with the dummy structure $404_2$.

FIG. 4B illustrates a top view of the individual 3DIC structures 1004 singulated from the wafer-level die structure 1000 in the die regions $113_1$, $113_2$, $113_4$ and $113_5$ illustrated in FIG. 4A in accordance with some embodiments. Such the singulation process also singulates the dummy structures $404_2/404_3/404_4$ and form individual (chip-level or die-level) dummy structures $404_{21}$, $404_{22}$, $404_{23}$, $404_{24}/404_{31}$, $404_{32}/404_{41}$ and $404_{42}$ respectively. The dummy structures $404_{21}$, $404_{22}$, $404_{23}$, $404_{24}$, $404_{31}$, $404_{32}$, $404_{41}$ and $404_{42}$ are disposed different regions, and thereby the 3DIC structures 1004 in the die regions $113_1$, $113_2$, $113_4$, and $113_5$ have different structures.

The 3DICstructure 1004 in the die region $113_1$ includes the IC die 104, and the device dies 204 and 304, two dummy structures $404_1$, and one dummy structure $404_{21}$ on the IC die 104. In some embodiments, the dummy structures $404_1$ have rectangular shapes, and the dummy structure $404_{21}$ has a rectangular ring shape in a top view. The device dies 204 and 304 and the dummy structure $404_1$ are surround by the encapsulate 127 and the dummy structures $404_{21}$. The configurations of the dummy structures $404_1$ and $404_{21}$ are similar to the configurations of the dummy structures $404_1$ and $404_2$ of the embodiment illustrated in FIG. 3B, and description is not repeated herein.

The 3DIC structure 1004 in the die region $113_2$ includes the device dies 204 and 304, two dummy structures $404_1$, two dummy structures $404_{22}$ and two dummy structures $404_{41}$. The dummy structures $404_1$, $404_{22}$ and $404_{41}$ have rectangular shapes in a top view. The device dies 204 and 304 and the dummy structure $404_1$ are surround by the encapsulate 127 and the dummy structures $404_{22}$ and $404_{41}$. The configurations of the dummy structures $404_1$ are similar to the configurations of the dummy structures $404_1$ of the embodiment illustrated in FIG. 3B, and description is not repeated herein.

The dummy structures $404_{22}$ extend along the first direction D1, and the dummy structures $404_{41}$ extend along the second direction D2. The dummy structure $404_{22}$ has the length W422 along the first direction D1, and the dummy structure $404_{41}$ has the length H441 along the second direction D2. In some embodiments, the length W422 of the dummy structures $404_{22}$ along the first direction D1 may be equal to the length W1 of the IC die 104 along the second direction D2, and the length H441 of the dummy structures $404_{41}$ along the second direction D2 may be less than the length H1 of the IC die 104 along the second direction D2.

In the first direction D1, two sidewall SW4221 of the two dummy structures $404_{22}$ are aligned with two sidewalls SW1 of the IC die 104. In the second direction D2, two sidewalls SW441 of the two dummy structures $404_{41}$ are aligned with the other two sidewalls SW1 of the IC die 104. Each sidewall SW4221 of the dummy structures $404_{22}$ is substantially level or coplanar with the sidewall SW1 of the IC die 104. Each sidewall SW441 of the dummy structures $404_{41}$, is substantially level or coplanar with two sidewalls SWe of the encapsulate 127, two sidewalls SW4222 of the dummy structures $404_{22}$, and substantially level or coplanar with the sidewall SW1 of the IC die 104. Four corners C of the IC die 104 of the respective 3DIC structures 1004 in the die region $113_2$ are overlaid with the two dummy structures $404_{22}$.

The 3DIC structure 1004 in the die region $113_4$ includes the device dies 204 and 304, two dummy structures $404_1$, two dummy structures $404_{31}$ and two dummy structures $404_{23}$. The dummy structures $404_1$, $404_{31}$ and $404_{23}$ have rectangular shapes in a top view. The device dies 204 and 304 and the dummy structure $404_1$ are surround by the encapsulate 127 and the dummy structures $404_{31}$ and $404_{23}$. The configurations of the dummy structures $404_1$ are similar to the configurations of the dummy structures $404_1$ of the embodiment illustrated in FIG. 3B, and description is not repeated herein.

The dummy structures $404_{31}$ extend along the first direction D1, and the dummy structures $404_{23}$ extend along the second direction D2. The dummy structures $404_{31}$ has the length W431 along the first direction D1, and the dummy structures $404_{23}$ has the length H423 along the second direction D2. In some embodiments, the length W431 of the dummy structures $404_{31}$ may be less than the length W1 of the IC die 104, and the length H423 of the dummy structures $404_{23}$ may be equal to the length H1 of the IC die 104.

In the first direction D1, two sidewalls SW431 of the two dummy structures $404_{31}$ are aligned with two sidewalls SW1 of the IC die 104. In the second direction D2, two sidewalls SW4231 of the two dummy structures $404_{23}$ are aligned with the other two sidewalls SW1 of the IC die 104. Each sidewall SW431 of the dummy structures $404_{31}$ is substantially level or coplanar with two sidewalls SWe of the encapsulate 127, two sidewalls SW4232 of the dummy structures $404_{23}$ and substantially level or coplanar with the sidewall SW1 of the IC die 104. Each sidewall SW4231 of the dummy structures $404_{23}$, is substantially level or coplanar with the other sidewall SW1 of the IC die 104. Four corners C of the IC die 104 of the respective 3DIC structures 1004 in the die region $113_2$ are overlaid with the two dummy structures $404_{23}$.

The 3DIC structure 1004 in the die region $113_5$ includes the device dies 204 and 304, two dummy structures $404_1$, two dummy structures $404_{32}$, and two dummy structures $404_{42}$ and $404_{24}$. The dummy structures $404_1$, $404_{32}$, $404_{42}$ and $404_{24}$ have rectangular shapes in a top view. The device dies 204 and 304 and the dummy structure $404_1$ are surround by the encapsulate 127 and the dummy structures $404_{32}$, $404_{42}$ and $404_{24}$. The configurations of the dummy structures $404_1$ are similar to the configurations of the dummy structures $404_1$ of the embodiment illustrated in FIG. 3B, and description is not repeated herein.

The dummy structures $404_{32}$ extend along the first direction D1, and the dummy structures $404_{42}$ extend along the second direction D2. The dummy structures $404_{32}$ has the length W432 along the first direction D1, and the dummy structures $404_{42}$ has the length H442 along the second direction D2. In some embodiments, the length W432 of the dummy structures $404_{32}$ may be less than the length W1 of the IC die 104, and the length H442 of the dummy structures $404_{42}$ may be less than the length H1 of the IC die 104. Four corners C of the IC die 104 of the respective 3DIC structures 1004 in the die region $113_2$ are overlaid with four dummy structures $404_{24}$.

In the first direction D1, two sidewalls SW432 of the two dummy structures $404_{32}$ are aligned with two sidewalls SW1 of the IC die 104. In the second direction D2, two sidewalls SW4422 of the dummy structures $404_{42}$ are aligned with the other two sidewalls SW1 of the IC die 104. Each sidewall SW432 of the dummy structures $404_{32}$ is substantially level or coplanar with two sidewalls SWe of the encapsulate 127, two sidewalls SW4242 of the two dummy structures $404_{42}$ and substantially level or coplanar with the sidewall SW1 of the IC die 104. Each sidewall SW4422 of the dummy structures $404_{42}$, is substantially level or coplanar with two sidewalls SWe of the encapsulate 127, two sidewalls SW4241 of the dummy structures $404_{24}$ and substantially level or coplanar with the other sidewall SW1 of the IC die 104.

The 3DIC structure 1004 in the die region $113_1$, the encapsulate 127 is laterally wrapped by the dummy structure 404', and not exposed by the dummy structure 404'. The 3DICstructure 1004 in the die regions $113_2$, $113_4$ and $113_5$, most of the encapsulate 127 is wrapped by the dummy structure 404', and a small portion of the encapsulate 127 is exposed by the dummy structure 404'. In other words, an area of exposed sidewall SWe of the encapsulate 127 is less than an area of exposed sidewall of the dummy structure 404'.

Figure 5B:
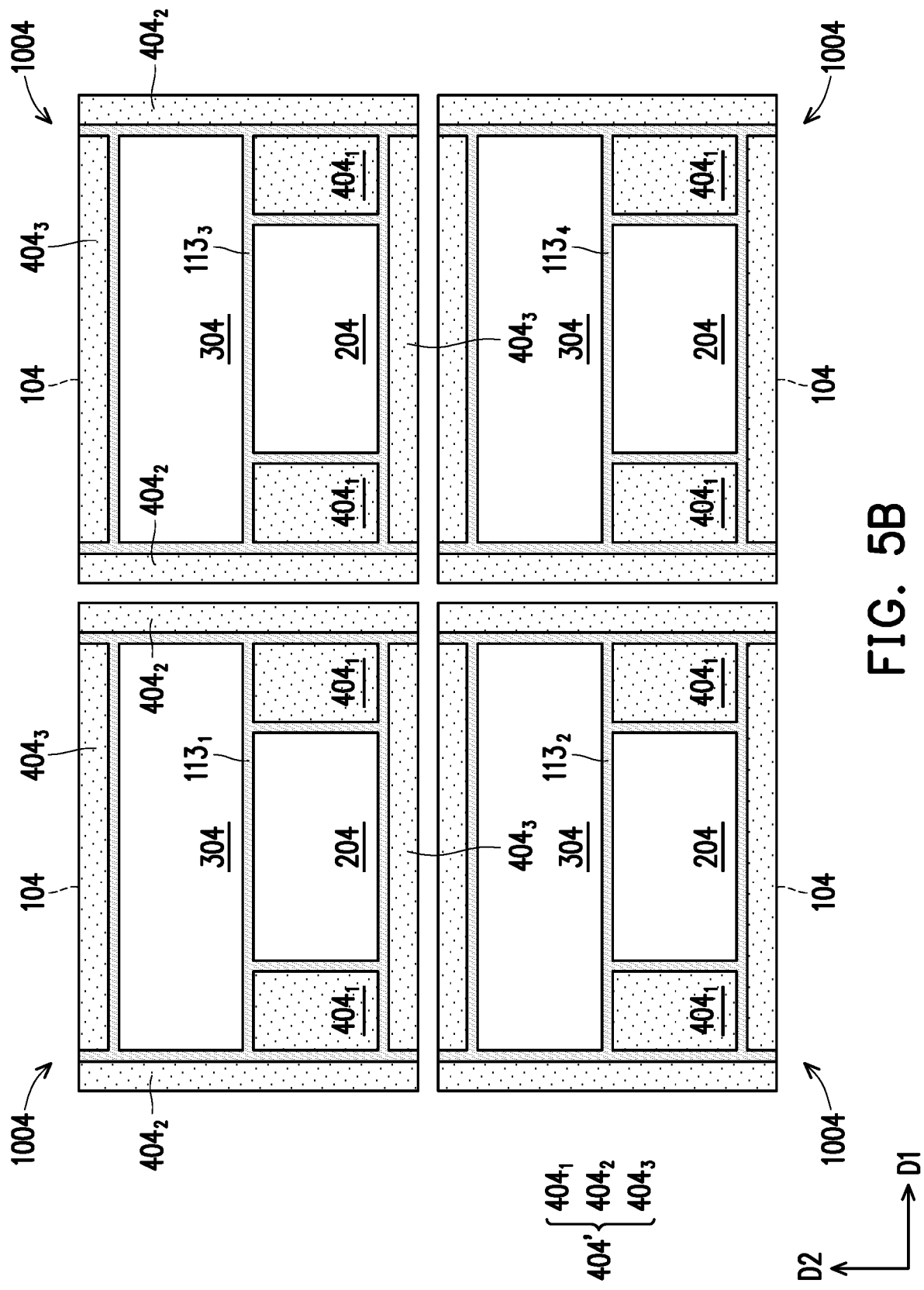
Figure 5C:
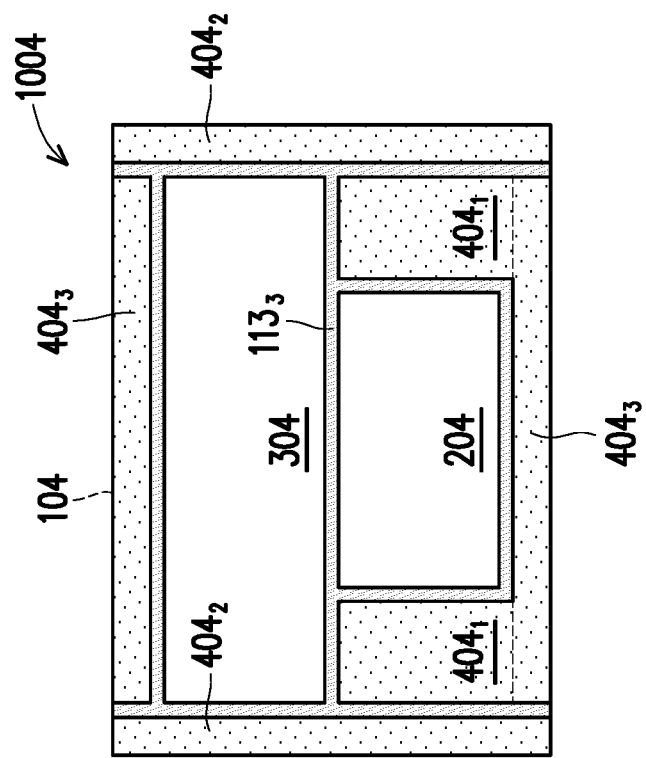
Figure 5C:
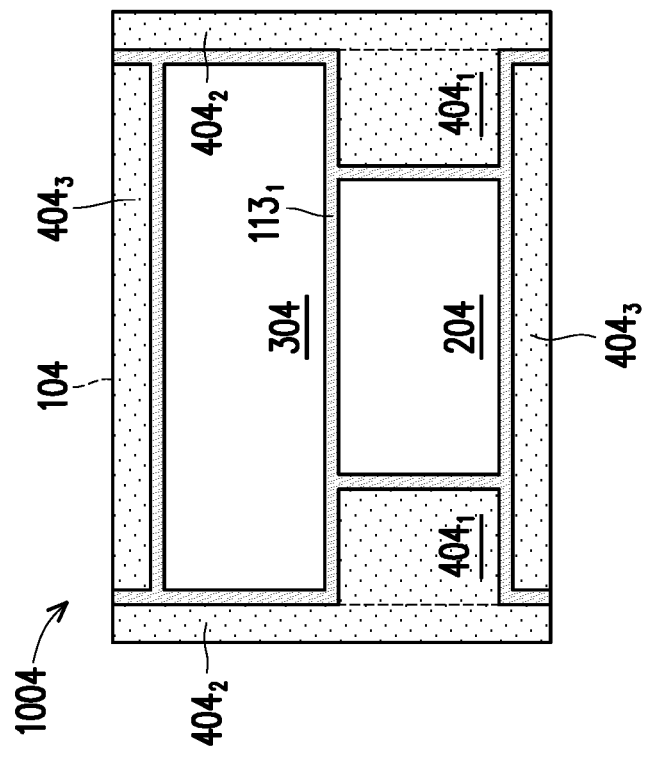

FIG. 5B illustrates a top view of the individual 3DIC structures 1004 singulated from the wafer-level die structure 1000 illustrated in FIG. 5A in accordance with some embodiments. After the wafer-level die structure 1000 is singulated along the scribe lines 9 and 11, the dummy structures $404_1$, $404_2$, and $404_3$ are remained in the individual 3DIC structures 1004. Each 3DIC structure 1004 includes the device dies 204 and 304, two dummy structures $404_1$, two dummy structures $404_2$, and two dummy structures $404_3$. The dummy structures $404_1$, $404_2$, and $404_3$ have rectangular shapes in a top view. The device dies 204 and 304 and the dummy structure $404_1$ are surround by the encapsulate 127 and the dummy structures $404_2$ and $404_3$. The configurations of the dummy structures $404_1$, $404_2$, and $404_3$ are similar to the configurations of the dummy structures $404_1$, $404_{31}$, and $404_{23}$ of the embodiment illustrated in FIG. 4B, and description is not repeated herein.

Figure 6B:
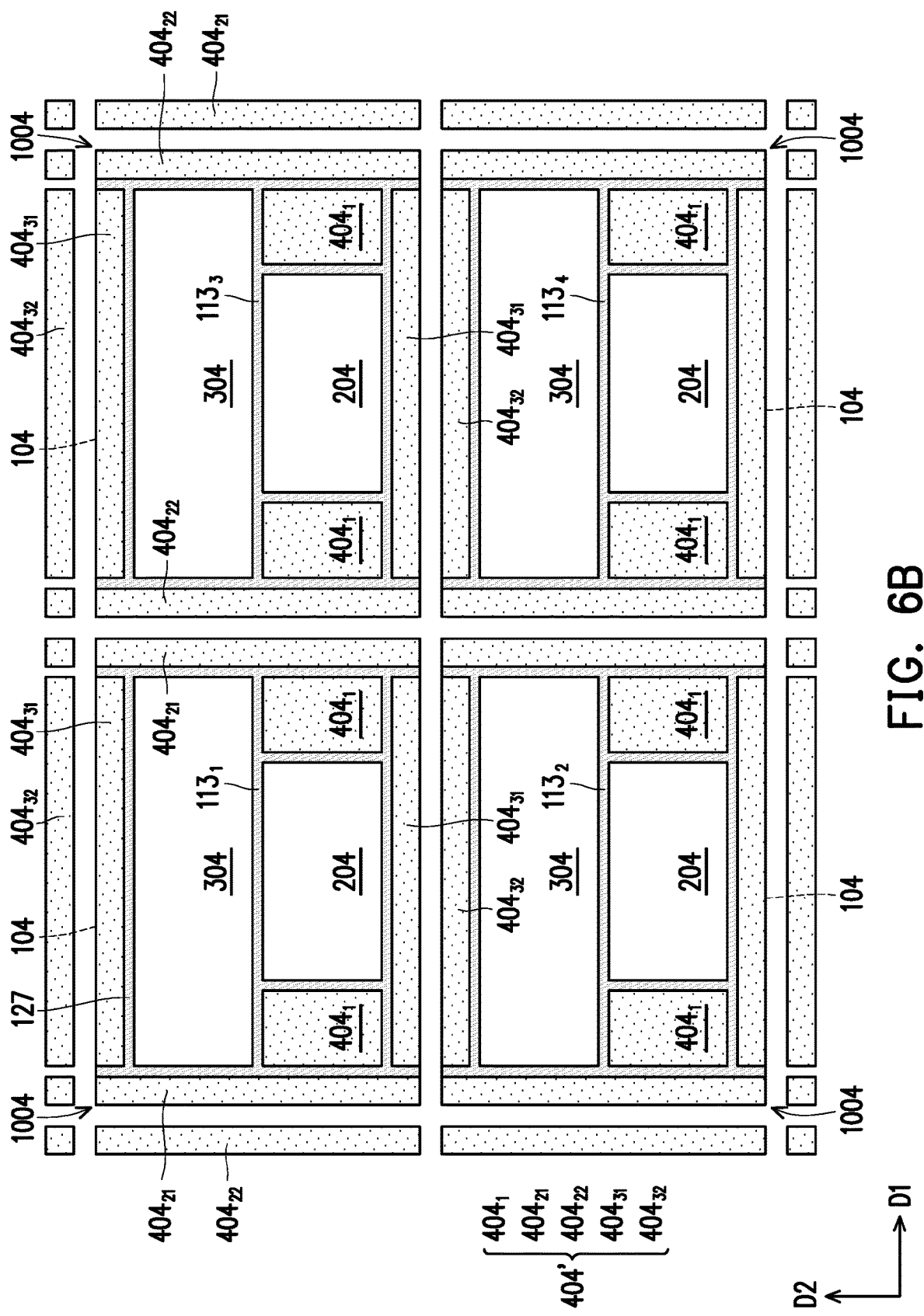
Figure 6C:
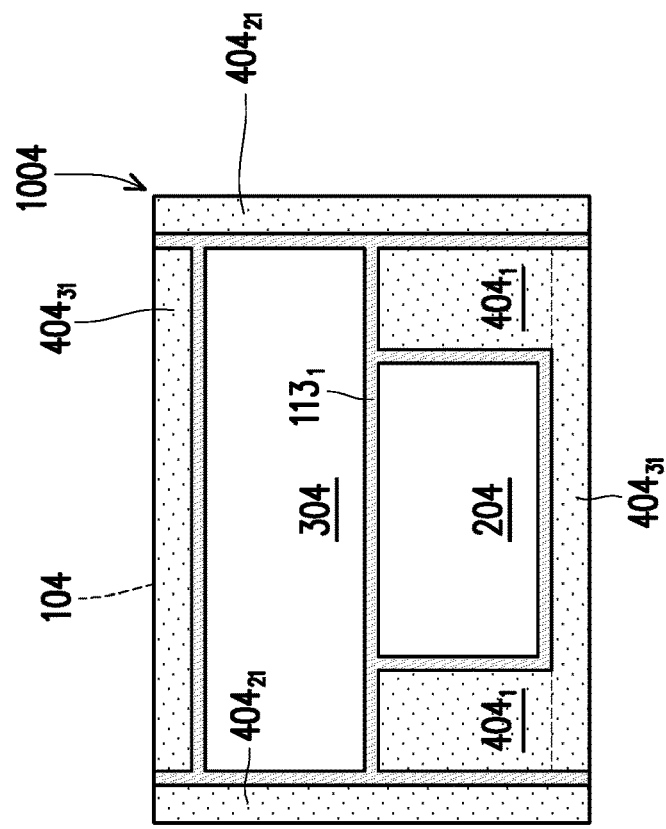
Figure 6C:
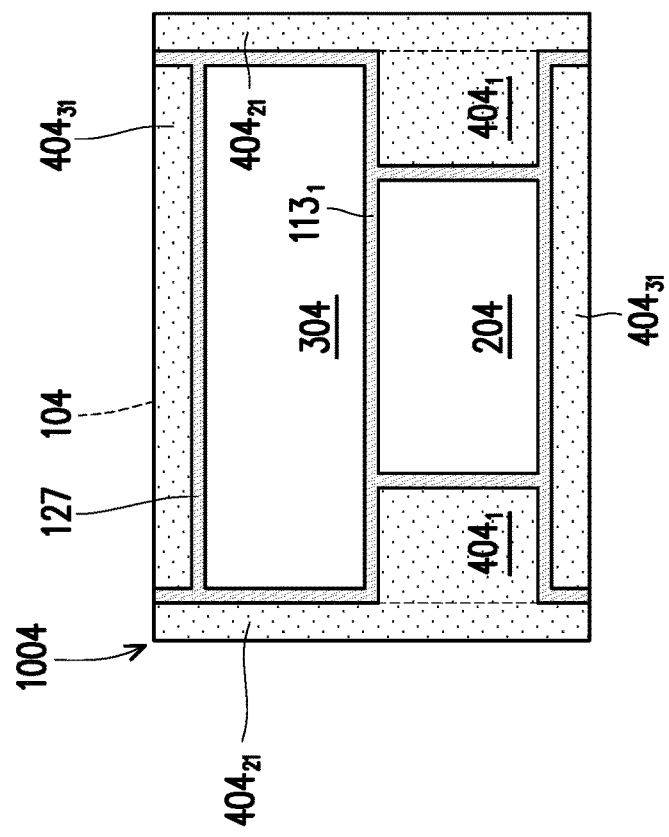

FIG. 6B illustrates a top view of the individual 3DIC structures 1004 singulated from the wafer-level die structure 1000 illustrated in FIG. 6A in accordance with some embodiments. After the wafer-level die structure 1000 is singulated along the scribe lines 9 and 11, the dummy structures $404_1$ are remained. Such the singulation process also singulates the dummy structures $404_2$ and $404_3$. The dummy structure $404_2$ forms individual dummy structures $404_{21}$ and $404_{22}$, and the dummy structure $404_3$ forms individual dummy structures $404_{31}$ and $404_{32}$. The dummy structures $404_{21}$ and $404_{22}$ may be have a same size or different sizes. The dummy structures $404_{31}$ and $404_{32}$ may be have a same size or different sizes. The configurations of the dummy structures $404_1$, $404_{21}$, $404_{22}$, $404_{31}$ and $404_{32}$ are similar to the configurations of the dummy structures $404_1$, $404_{31}$, and $404_{23}$ of the embodiment illustrated in FIG. 4B, and description is not repeated herein.

In some embodiments, one of the dummy structures 404' may be merged with other dummy structures 404' along the first direction D1 or/and the second direction D2 in the same die region 113i. For example, the dummy structures $404_1$ shown in FIGS. 3B to 6B may be merged with other dummy structures 404' in the same die region 113i along the first direction D1 or the second direction D2, and there is no interface between them, as shown in FIGS. 3C, 4C, 4D, 4E, 4F, 5C and 6C.

The dummy structures 404' being placed over the corners and/or edges of the IC dies 104 may help to prevent warpage during and after singulation of the packages. In addition, the dummy structures 404' can prevent warpage is to reduce the coefficient of thermal expansion (CTE) mismatch between the IC dies 104 and the encapsulant 127 as the dummy structures 404' have a similar CTE to the IC dies 104 and they reduce the amount of encapsulant 127 necessary in the package.

FIGS. 7A through 7E illustrate cross-sectional views of forming a package, in accordance with some embodiments.

Figure 7A:
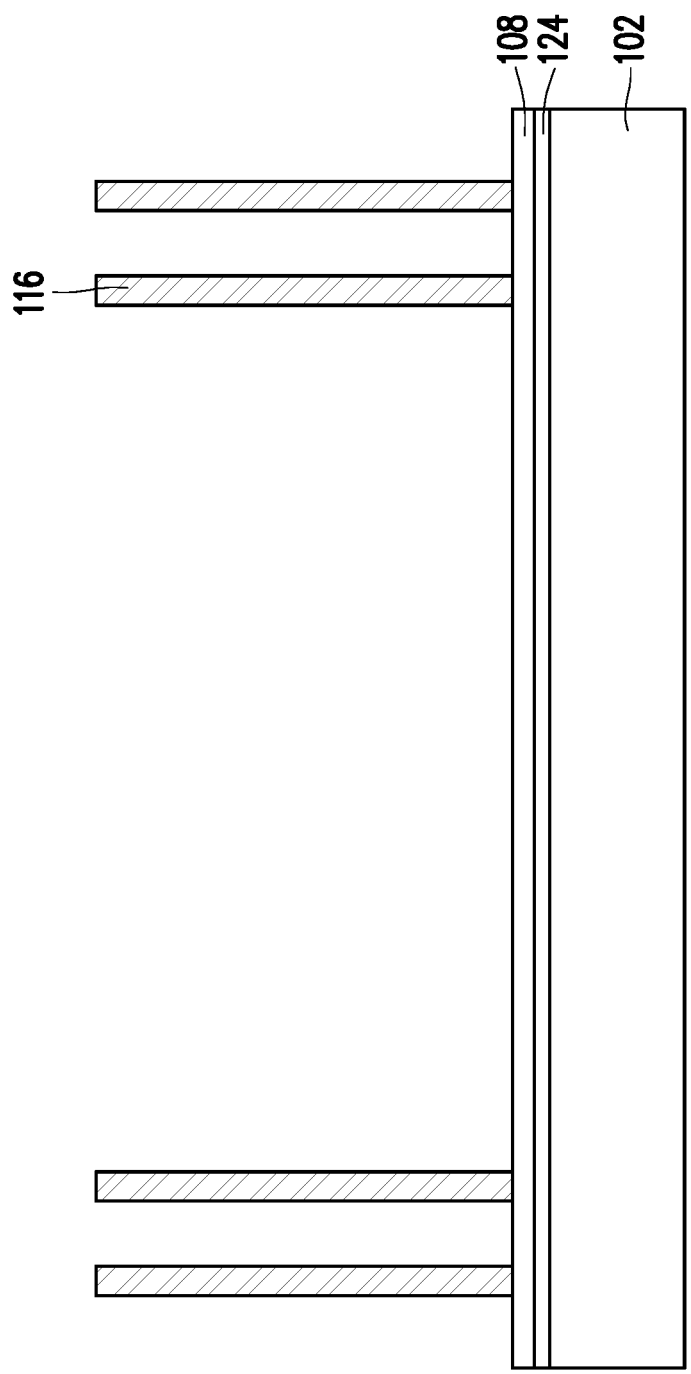
FIGS. 7A through 7E illustrate cross-sectional views of forming a package, in accordance with some embodiments.
Figure 7B:
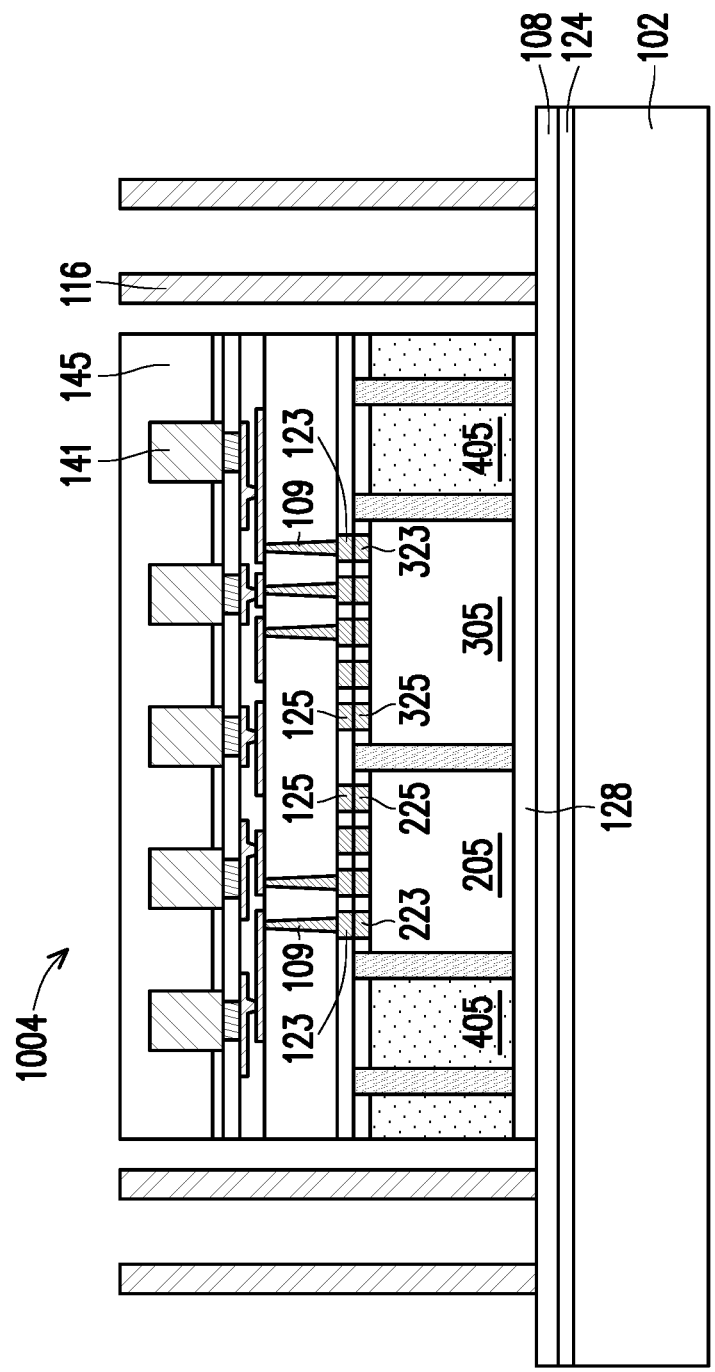
Figure 7C:
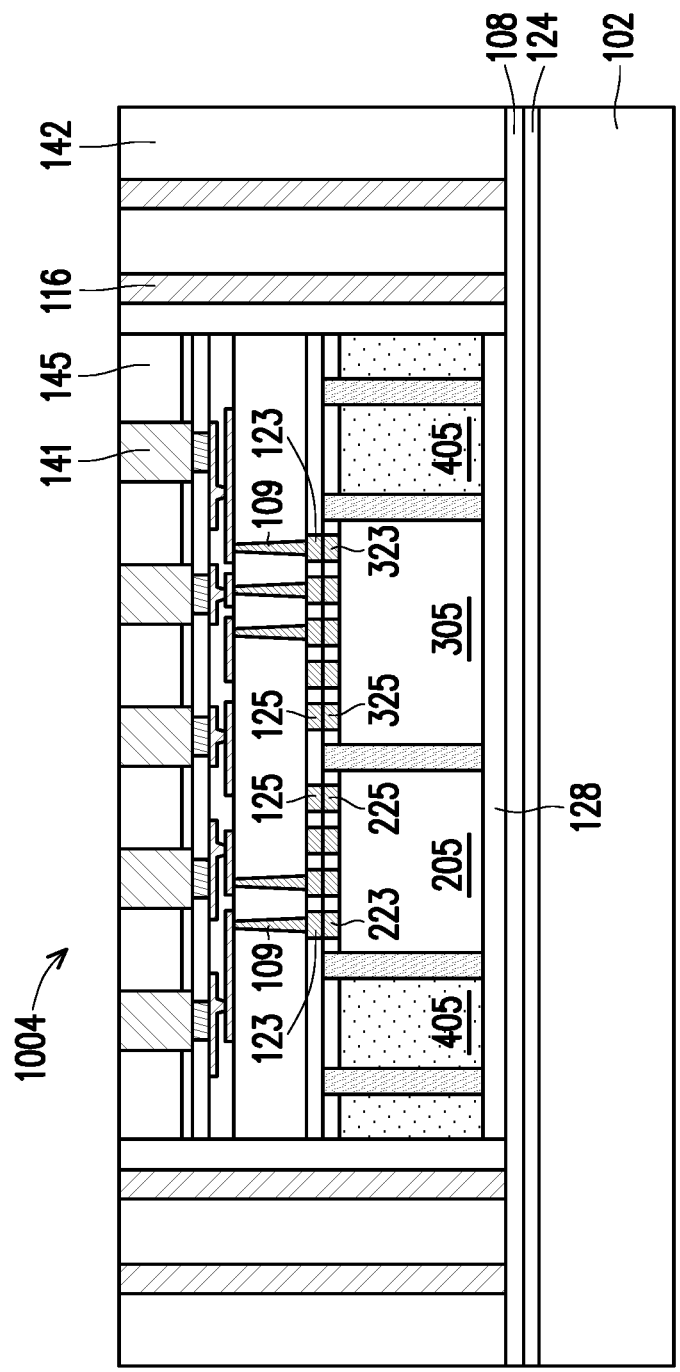

Referring to FIG. 7A, a carrier substrate 102 is provided, and a release layer 124 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 124 may be formed of a polymer-based material, which may be removed along with the carrier substrate 102 from the overlying structures that will be formed in subsequent steps. In some embodiments, the release layer 124 is an epoxy-based thermal-release material, which loses its adhesive property when heated, such as a light-to-heat-conversion (LTHC) release coating. In other embodiments, the release layer 124 may be an ultra-violet (UV) glue, which loses its adhesive property when exposed to UV lights. The release layer 124 may be dispensed as a liquid and cured, may be a laminate film laminated onto the carrier substrate 102, or may be the like. The top surface of the release layer 124 may be leveled and may have a high degree of planarity.

A dielectric layer 108 is formed on the release layer 124. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

Referring to FIG. 7A, conductive pillars 116 are formed on the release layer 124. As an example to form the conductive pillars 116, a seed layer is formed over the release layer 124. In some embodiments, the seed layer is a metal layer, which may be a single layer or a composite layer comprising a plurality of sub-layers formed of different materials. For example, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 116.

Referring to FIG. 7A, the 3DIC structures 1004 are adhered to the dielectric layer 108 by an adhesive 128. The adhesive 128 is on back-side surfaces of the 3DIC structures 1004 and adheres the 3DIC structures 1004 to the release layer 124. The adhesive 128 may be any suitable adhesive, epoxy, die attach film (DAF), or the like.

Referring to FIG. 7A, an encapsulant 142 is formed on the various components. After formation, the encapsulant 142 laterally encapsulates the conductive pillars 116 and 3DIC structures 1004. In some embodiments, the encapsulant 142 includes a molding compound, a molding underfill, a resin such as epoxy, a combination thereof, or the like. In some other embodiments, the encapsulant 142 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 142 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. The cross-section shape of the filler may be circle, oval, or any other shape. In some embodiments, the fillers include solid fillers, but the disclosure is not limited thereto. In some embodiments, a small portion of the fillers may be hollow fillers.

The encapsulant 142 may be applied by compression molding, transfer molding, spin-coating, lamination, deposition, or similar processes, and may be formed over the carrier substrate 102 such that the conductive pillars 116 and/or the 3DIC structures 1004 are buried or covered. The encapsulant 142 is then cured. The conductive pillars 116 penetrate the encapsulant 142, and the conductive pillars 116 are sometimes referred to as through vias 116 or through integrated fan-out vias (TIVs) 116.

Referring to FIG. 1B, a planarization process is then performed on the encapsulant 142 to remove a portion of the encapsulant 142, such that the top surfaces of the through vias 116 and the die connectors 141 are exposed. In some embodiments in which the top surfaces of the through vias 116 and the front-side surfaces of the 3DIC structures 1004 are not coplanar (as shown in FIG. 1A), portions of the through vias 116 or/and portions of the dielectric material 140 may also be removed by the planarization process. In some embodiments, top surfaces of the through vias 116, the die connectors 141, the dielectric material 140, and the encapsulant 142 are substantially coplanar after the planarization process. The planarization process may be, for example, a chemical-mechanical polish (CMP), a grinding process, or the like. In some embodiments, the planarization may be omitted, for example, if the through vias 116 and die connectors 141 are already exposed.

Referring to FIG. 1C, a front-side redistribution structure 144 is formed over front-side surfaces of the through vias 116, the encapsulant 142, and the 3DIC structures 1004. The front-side redistribution structure 144 includes dielectric layers 146, 150, 154, and 158; metallization patterns 148, 152, and 156; and under bump metallurgies (UBMs) 160. The metallization patterns may also be referred to as redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, the through vias 116, and the die connectors 141. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings exposing portions of the through vias 116 and the die connectors 141. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 may be developed after the exposure.

The metallization pattern 148 is then formed. The metallization pattern 148 includes conductive lines CL on and extending along the top surface of the dielectric layer 146. The metallization pattern 148 further includes conductive vias V extending through the dielectric layer 146 to be physically and electrically connected to the through vias 116 and the 3DIC structures 1004. The sidewalls of the conductive vias V and the conductive lines CL may be straight or inclined. In some embodiments, the conductive via V has inclined sidewall and is tapered toward the 3DIC structures 1004. To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 148. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layers 150, 154, 158, and the metallization patterns 152, 156 are formed alternately. The dielectric layer 150, 154, and 158 may be formed in a manner similar to the dielectric layer 146, and may be formed of the same material as the dielectric layer 146. The metallization patterns 152 and 156 may include conductive lines CL on the underlying dielectric layer and conductive vias V extending through the underlying dielectric layer respectively. The metallization patterns 152 and 156 may be formed in a manner similar to the metallization pattern 148, and may be formed of the same material as the metallization pattern 148. The UBMs 160 are optionally formed on and extending through the dielectric layer 158. The UBMs 160 may be formed in a manner similar to the metallization pattern 148, and may be formed of the same material as the metallization pattern 148.

Referring to FIG. 1C, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes.

Figure 7D:
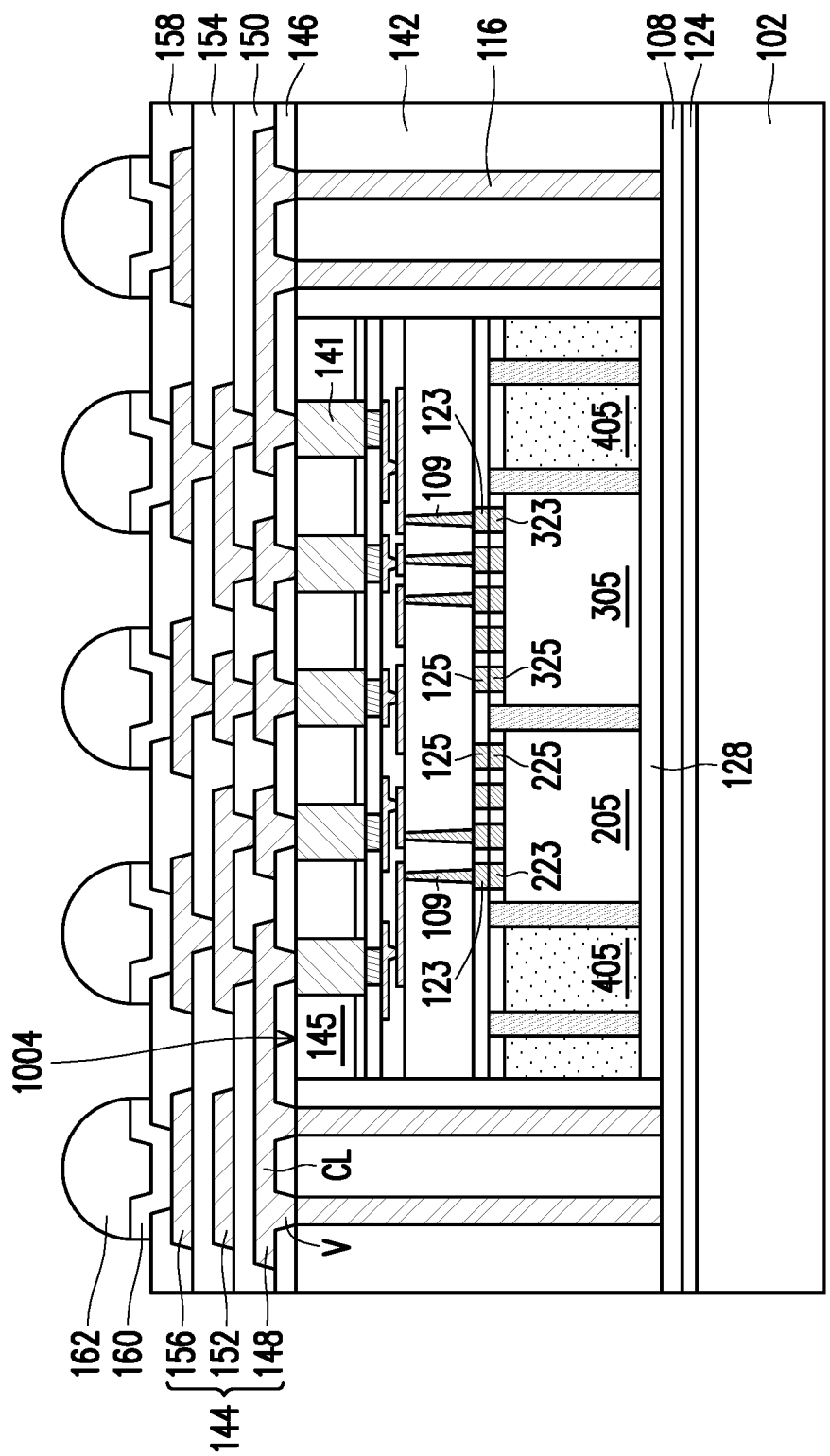
Figure 7E:
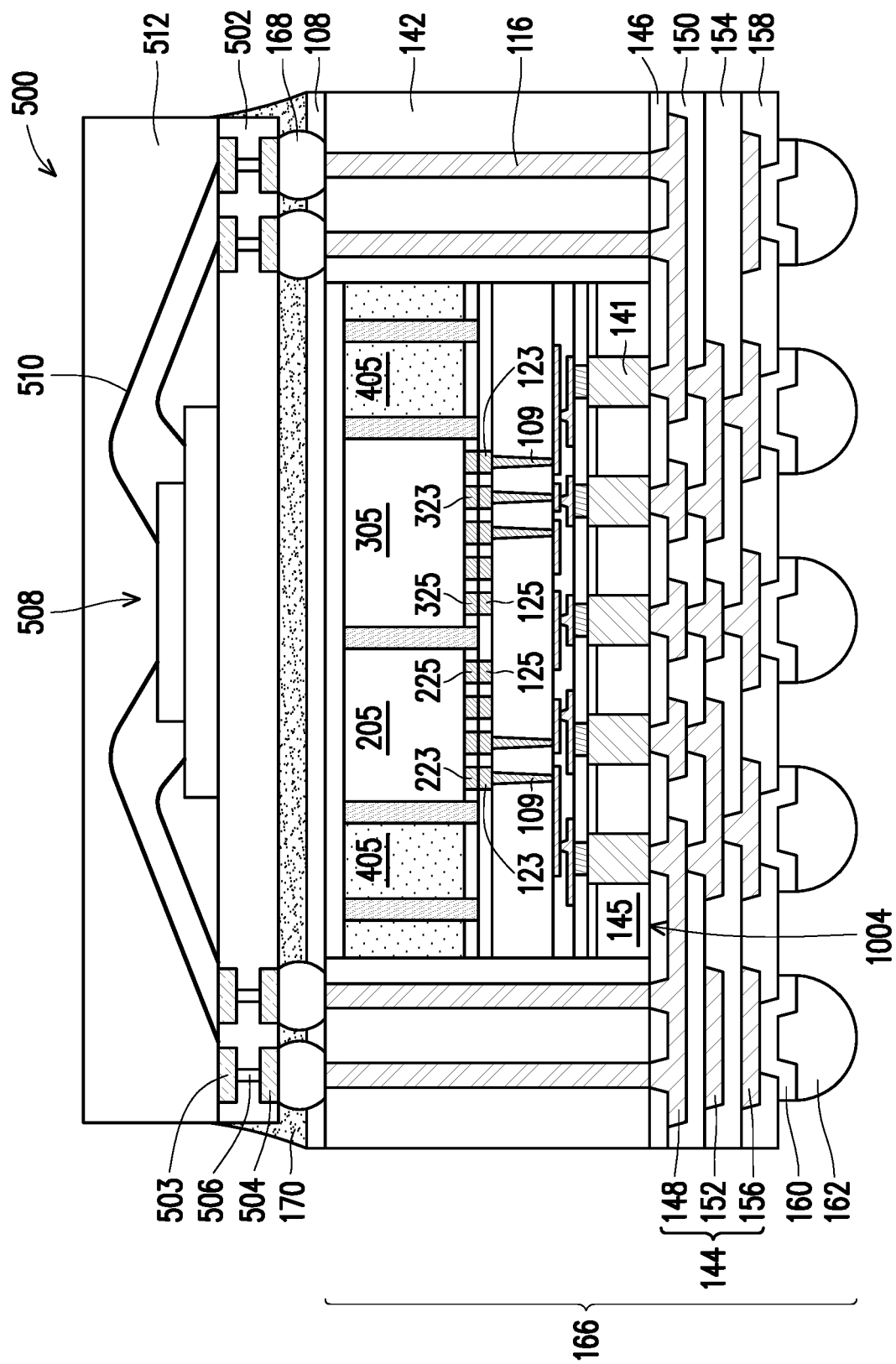

Referring to FIGS. 7D and 7E, a carrier substrate de-bonding is performed to detach (or "de-bond") the carrier substrate 102 from the dielectric layer 108 to form an InFO package 166. In accordance with some embodiments, the de-bonding includes projecting a light such as a laser light or an UV light on the release layer 124 so that the release layer 124 decomposes under the heat of the light and the carrier substrate 102 may be removed. The InFO package 166 is then flipped over and placed on a tape (not shown).

Referring to FIG. 7E, a top package 500 may be bonded to InFO package 166. The top package 500 includes a substrate 502 and one or more stacked dies (or dies) 508 coupled to the substrate 502. The substrate 502 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 502 may be a SOI substrate. Generally, an SOI substrate includes a layer of a semiconductor material such as epitaxial silicon, germanium, silicon germanium, SOI, silicon germanium on insulator (SGOI), or combinations thereof. The substrate 502 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 502.

The substrate 502 may include active and passive devices (not shown). As one of ordinary skill in the art will recognize, a wide variety of devices such as transistors, capacitors, resistors, combinations of these, and the like may be used to generate the structural and functional requirements of the design for the top package 500. The devices may be formed using any suitable methods.

The substrate 502 may also include metallization layers (not shown) and through vias 506. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 502 is substantially free of active and passive devices.

The substrate 502 may have bond pads 503 on a first side the substrate 502 to couple to the stacked dies 508, and bond pads 504 on a second side of the substrate 502, the second side being opposite the first side of the substrate 502, to couple to the conductive connectors 168. In some embodiments, the bond pads 503 and 504 are formed by forming recesses (not shown) into dielectric layers (not shown) on the first and second sides of the substrate 502. The recesses may be formed to allow the bond pads 503 and 504 to be embedded into the dielectric layers. In other embodiments, the recesses are omitted as the bond pads 503 and 504 may be formed on the dielectric layer. In some embodiments, the bond pads 503 and 504 include a thin seed layer (not shown) made of copper, titanium, nickel, gold, palladium, the like, or a combination thereof. The conductive material of the bond pads 503 and 504 may be deposited over the thin seed layer. The conductive material may be formed by an electrochemical plating process, an electroless plating process, CVD, ALD, PVD, the like, or a combination thereof. In an embodiment, the conductive material of the bond pads 503 and 504 is copper, tungsten, aluminum, silver, gold, the like, or a combination thereof. In an embodiment, the bond pads 503 and 504 are UBMs that are formed using the same or similar processes as described earlier in connection with UBMs 160.

In the illustrated embodiment, the stacked dies 508 are coupled to the substrate 502 by wire bonds 510, although other connections may be used, such as conductive bumps. In an embodiment, the stacked dies 508 are stacked memory dies. For example, the stacked memory dies 508 may include low-power (LP) double data rate (DDR) memory modules, such as LPDDR1, LPDDR2, LPDDR3, LPDDR4, or the like memory modules.

In some embodiments, the stacked dies 508 and the wire bonds 510 may be encapsulated by a molding material 512. The molding material 512 may be molded on the stacked dies 508 and the wire bonds 510, for example, using compression molding. In some embodiments, the molding material 512 is a molding compound, a polymer, an epoxy, silicon oxide filler material, the like, or a combination thereof. A curing step may be performed to cure the molding material 512, wherein the curing may be a thermal curing, a UV curing, the like, or a combination thereof.

In some embodiments, the stacked dies 508 and the wire bonds 510 are buried in the molding material 512, and after the curing of the molding material 512, a planarization step, such as a grinding, is performed to remove excess portions of the molding material 512 and provide a substantially planar surface for the top packages 500.

After the top packages 500 are formed, the top packages 500 are bonded to the InFO packages 166 by way of the conductive connectors 168 and the bond pads 504. In some embodiments, the stacked memory dies 508 may be coupled to the 3DICstructure 1004 through the wire bonds 510, the bond pads 503 and 504, through vias 506, the conductive connectors 168, and the through vias 116.

The conductive connectors 168 may be similar to the connectors 68 described above and the description is not repeated herein, although the conductive connectors 168 and 68 need not be the same. In some embodiments, before bonding the conductive connectors 168, the conductive connectors 168 are coated with a flux (not shown), such as a no-clean flux. The conductive connectors 168 may be dipped in the flux or the flux may be jetted onto the conductive connectors 168.

In some embodiments, the conductive connectors 168 may have an epoxy flux (not shown) formed thereon before they are reflowed with at least some of the epoxy portion of the epoxy flux remaining after the top package 500 is attached to the InFO package 166. This remaining epoxy portion may act as an underfill to reduce stress and protect the joints resulting from the reflowing the conductive connectors 168. In some embodiments, an underfill 170 may be formed between the top package 500 and the InFO package 166 and surrounding the conductive connectors 168. The underfill 170 may be formed by a capillary flow process after the top package 500 is attached or may be formed by a suitable deposition method before the top package 500 is attached.

The bonding between the top package 500 and the InFO package 166 may be a solder bonding or a direct metal-to-metal (such as a copper-to-copper or tin-to-tin) bonding. In an embodiment, the top package 500 is bonded to the InFO package 166 by a reflow process. During this reflow process, the conductive connectors 168 are in contact with the bond pads 504 and the through vias 116 to physically and electrically couple the top package 500 to the InFO package 166.

The disclosed embodiments of a package structure include dummy structures in the die region or further in the scribe line regions. The dummy structures may allow for more control of the ratio of the encapsulant and thus may reduce the stress and warpage from the coefficient of thermal expansion (CTE) mismatch.

In accordance with some embodiments of the disclosure, a method including: bonding a first die and a second die to a wafer in a first die region of the wafer through hybrid bonding; bonding a first dummy structure to the wafer in the first die region and a first scribe line of the wafer; and singulating the wafer and the first dummy structure along the first scribe line to form a stacked integrated circuit (IC) structure.

In accordance with alternative embodiments of the disclosure, a method including: bonding a first die and a second die to a wafer in a die region of the wafer; bonding a first dummy structure to the wafer in the die region to overlay a plurality of corners of the die region; and singulating the wafer to form a stacked integrated circuit (IC) structure.

In accordance with some embodiments of the disclosure, a structure including: a bottom die; a first die bonded to a first side of the bottom die; a second die boned to the first side of the bottom die; an encapsulant laterally encapsulating the first die and the second die; and a first dummy die bonded to the first side of the bottom die, wherein a sidewall of the first dummy die is coplanar with a first sidewall of the bottom die.

What is claimed is:

1. A method comprising:
bonding a first die and a second die to a wafer in a first die region of the wafer through hybrid bonding;
bonding a first dummy structure to the wafer in the first die region; and
singulating the wafer and the first dummy structure along a first scribe line to form a stacked integrated circuit (IC) structure,
wherein the first dummy structure has a continuous ring shape surrounding the first die region.

2. The method of claim 1, wherein the first dummy structure is bonded in an area surrounded by the first die, the second die, the first scribe line and a second scribe line of the wafer, and extends to a second die region.

3. The method of claim 1, wherein the first dummy structure extends from the first die region to a second die region of the wafer.

4. The method of claim 1, wherein the first dummy structure overlaps the first scribe line and a second scribe line of the wafer, and the first scribe line and the second scribe are along different directions.

5. The method of claim 4, further comprising:
bonding a second dummy structure to the wafer in a second die region and the first scribe line of the wafer; and
bonding a third dummy structure to the wafer in a third region and the second scribe line of the wafer.

6. The method of claim 1, wherein the first dummy completely surrounds each of the first die and the second die.

7. The method of claim 6, wherein the wafer comprises a third die having a second insulating layer, and the first dummy structure is boned to the third die through fusion bonding the first insulating layer and the second insulating layer, and the hybrid bonding comprises metal-to-metal direct bonding and dielectric-to-dielectric bonding.

8. The method of claim 1, wherein the first dummy structure is a dummy die, and the dummy die includes a silicon substrate and a first insulating layer on the silicon substrate.

9. A method comprising:
bonding a first die and a second die to a wafer in a die region of the wafer;
bonding a first dummy structure to the wafer in the die region to overlay a plurality of corners of the die region; and
singulating the wafer to form a stacked integrated circuit (IC) structure,
wherein the first dummy structure comprises a first portion and a second portion connected each other and extended along different directions, and
wherein the first dummy structure is a dummy die, and the dummy die includes a silicon substrate and a first insulating layer on the silicon substrate.

10. The method of claim 9, wherein the wafer comprises:
a third die having a second insulating layer, and the first dummy structure is boned to the third die through fusion bonding a first insulating layer and the second insulating layer, and the first die and the second die are bonded to the third die through hybrid bonding, and the hybrid bonding comprises metal-to-metal direct bonding and dielectric-to-dielectric bonding.

11. The method of claim 9, wherein the first dummy structure has a rectangular shape or a ring shape in a top view.

12. The method of claim 9, further comprising:
bonding a second dummy structure to the wafer in the die region, wherein the first dummy structure is adjacent to a first scribe line of the wafer and the second dummy structure is adjacent to a second scribe line of the wafer, and the first scribe line and the second scribe line are along different directions.

13. A method comprising:
bonding first dies and second dies to a wafer in a first die region and a second die region of the wafer, wherein the first die region comprises a first one of the first dies and a first one of the second dies, and the second die region comprises a second one of the first dies and a second one of the second dies;
bonding a first dummy structure to the wafer, wherein the first dummy structure spans from the first die region to the second die region of the wafer, the first dummy structure is located between the first one and the second one of the second dies, and the first dies are arranged side by side without a dummy structure in between; and
singulating the wafer and the first dummy structure along a first scribe line to form a stacked integrated circuit (IC) structure.

14. The method of claim 13, further comprising an encapsulate surrounding the first dies, the second dies and the first dummy structure.

15. The method of claim 13, wherein the first dummy structure has a rectangular shape in a top view.

16. The method of claim 13, wherein a sidewall of the first dummy structure is flushed with sidewalls of the first one and the second one of the second dies.

17. The method of claim 13, further comprising bonding a second dummy structure to the wafer, wherein the first dummy structure and the second dummy structure are located at opposite sides of the first one of the second dies.

18. The method of claim 13, wherein bonding the first dummy structure to the wafer comprises a fusion bonding.

19. The method of claim 13, wherein bonding the first dies and the second dies to the wafer comprises a hybrid bonding.

20. The method of claim 19, wherein the hybrid bonding comprises metal-to-metal direct bonding and dielectric-to-dielectric bonding.

* * * * *